(12) United States Patent
Matsumoto et al.

(10) Patent No.: US 9,165,975 B2
(45) Date of Patent: *Oct. 20, 2015

(54) SOLID-STATE IMAGING DEVICE, METHOD FOR MANUFACTURING SOLID-STATE IMAGING DEVICE, AND IMAGING APPARATUS

(71) Applicant: Sony Corporation, Tokyo (JP)

(72) Inventors: Takuji Matsumoto, Kanagawa (JP); Keiji Tatani, Kanagawa (JP); Yasushi Tateshita, Kanagawa (JP); Kazuichiro Itonaga, Tokyo (JP)

(73) Assignee: SONY CORPORATION (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/590,374

(22) Filed: Jan. 6, 2015

(65) Prior Publication Data

US 2015/0115341 A1   Apr. 30, 2015

Related U.S. Application Data

(63) Continuation of application No. 13/926,916, filed on Jun. 25, 2013, now Pat. No. 8,953,077, which is a continuation of application No. 12/509,995, filed on Jul. 27, 2009, now Pat. No. 8,525,909.

(30) Foreign Application Priority Data

Aug. 1, 2008   (JP) .................................. 2008-199520
Jan. 20, 2009  (JP) .................................. 2009-009523

(51) Int. Cl.
H01L 27/146   (2006.01)
H04N 5/335    (2011.01)
H01L 29/51    (2006.01)

(52) U.S. Cl.
CPC ...... *H01L 27/14643* (2013.01); *H01L 27/1461* (2013.01); *H01L 27/14609* (2013.01); *H01L 27/14612* (2013.01); *H01L 27/14614* (2013.01); *H01L 27/14683* (2013.01); *H01L 29/518* (2013.01); *H04N 5/335* (2013.01)

(58) Field of Classification Search
CPC .. H04N 5/335; H04N 5/378; H01L 27/14643; H01L 27/14609
USPC .......... 348/294, 302, 308, 311; 257/291, 292; 250/208.1
See application file for complete search history.

(56) References Cited

U.S. PATENT DOCUMENTS

| | | | | |
|---|---|---|---|---|
| 7,920,192 B2 * | 4/2011 | Watanabe et al. | ............. | 348/308 |
| 8,525,909 B2 * | 9/2013 | Matsumoto et al. | .......... | 348/308 |
| 2007/0069316 A1 * | 3/2007 | Lee | ................................. | 257/431 |
| 2008/0048210 A1 * | 2/2008 | Shima | ........................... | 257/192 |

FOREIGN PATENT DOCUMENTS

JP   2007311804 A   * 11/2007  ............. H04N 5/335

* cited by examiner

*Primary Examiner* — Nhan T Tran
(74) *Attorney, Agent, or Firm* — Sheridan Ross P.C.

(57) ABSTRACT

A solid-state imaging device includes, in a semiconductor substrate, a pixel portion provided with a photoelectric conversion portion, which photoelectrically converts incident light to obtain an electric signal and a peripheral circuit portion disposed on the periphery of the pixel portion, wherein a gate insulating film of aMOS transistor in the peripheral circuit portion is composed of a silicon oxynitride film, a gate insulating film of aMOS transistor in the pixel portion is composed of a silicon oxynitride film, and an oxide film is disposed just above the photoelectric conversion portion in the pixel portion.

12 Claims, 47 Drawing Sheets

FIG. 35
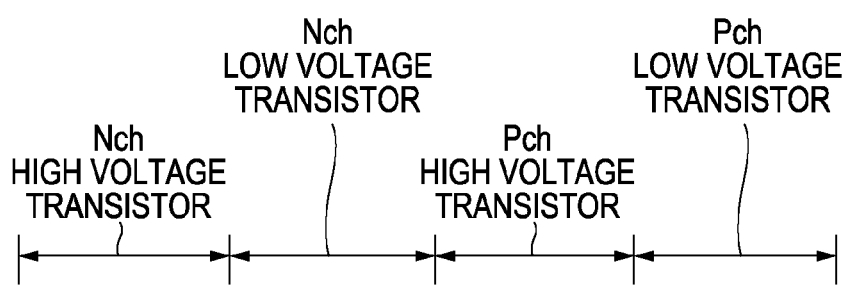
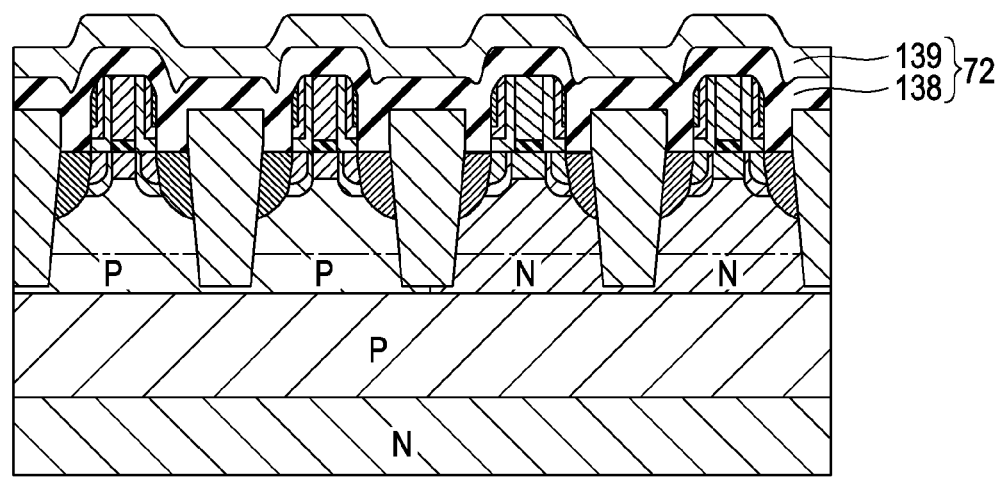

PRIOR ART

SOLID-STATE IMAGING DEVICE, METHOD FOR MANUFACTURING SOLID-STATE IMAGING DEVICE, AND IMAGING APPARATUS

CROSS REFERENCE TO RELATED APPLICATION

The present application is a continuation of U.S. patent application Ser. No. 13/926,916, filed Jun. 25, 2013, which is a continuation of U.S. patent application Ser. No. 12/509,995, filed Jul. 27, 2009, now U.S. Pat. No. 8,525,909, which claims priority to Japanese Patent Application Nos. JP 2008-199520 and JP 2009-009523, filed in the Japanese Patent Office on Aug. 1, 2008 and Jan. 20, 2009, respectively, the entire disclosures of which are hereby incorporated herein by reference.

BACKGROUND OF THE INVENTION

1. Field of the Invention

The present invention relates to a solid-state imaging device, a method for manufacturing the solid-state imaging device, and an imaging apparatus.

2. Description of the Related Art

Regarding a solid-state imaging device, e.g., a CMOS sensor, including a pixel portion provided with a photoelectric conversion portion, which photoelectrically converts incident light to obtain an electric signal, and a peripheral circuit portion disposed on the periphery of the pixel portion, in a semiconductor substrate, a gate insulating film of the peripheral circuit portion (logic element portion) has become thinner as the element has become finer. Along with that, an increase in tunnel current of the gate insulating film becomes a problem. In the MOS transistor technology, a silicon oxynitride film is used as the gate insulating film in order to suppress a tunnel current of the gate insulating film (refer to, for example, Japanese Patent No. 3752241).

In the case where a logic transistor, which includes a silicon oxynitride film serving as a gate insulating film of an element (MOS transistor) disposed in the peripheral circuit portion of the CMOS sensor, is applied, it is desirable that the performance of the CMOS sensor does not deteriorate.

In addition, as shown in FIG. 46, if a gate insulating film 31 composed of a silicon oxynitride film remains on a photoelectric conversion portion (for example, photodiode) 21, there is a problem in that deterioration in white defect occurs because of a fixed charge in the gate insulating film 31.

Furthermore, as shown in FIG. 47, regarding an antireflection film just above a photoelectric conversion portion (for example, photodiode) 21, since a three layer structure (not shown in the drawing) of silicon oxide film/silicon nitride film/silicon oxide film becomes a multiple structure of silicon oxide ($SiO_2$) film/silicon nitride (SiN) film/silicon oxide ($SiO_2$) film/silicon oxynitride film, the light undergoes multiple reflection and the ripple property in dispersion of light deteriorates. Moreover, since the ripple property deteriorates, a problem occurs in that variations in dispersion of light increase between chips.

In addition, there is a problem in that optimization becomes complicated because of a multiple structure.

SUMMARY OF THE INVENTION

The present inventors have recognized that in the case where a silicon oxynitride film is applied to a gate insulating film of a MOS transistor in a peripheral circuit portion, the performance of a photoelectric conversion portion (photodiode) of a CMOS sensor deteriorates.

It is desirable to apply a silicon oxynitride film to a gate insulating film of a MOS transistor in a peripheral circuit portion and suppress deterioration of performance of a photoelectric conversion portion.

A solid-state imaging device according to an embodiment of the present invention includes, in a semiconductor substrate, a pixel portion provided with a photoelectric conversion portion, which photoelectrically converts incident light to obtain an electric signal and a peripheral circuit portion disposed on the periphery of the above-described pixel portion, wherein a gate insulating film of a MOS transistor in the above-described peripheral circuit portion is composed of a silicon oxynitride film, a gate insulating film of a MOS transistor in the above-described pixel portion is composed of a silicon oxynitride film, and an oxide film is disposed just above the photoelectric conversion portion in the above-described pixel portion.

In the solid-state imaging device according to an embodiment of the present invention, since the gate insulating films in the peripheral circuit portion and the pixel portion are composed of the silicon oxynitride film, generation of a tunnel current is prevented. Furthermore, since the oxide film instead of the silicon oxynitride film is disposed just above the photoelectric conversion portion, deterioration in white defect and dark current due to a fixed charge in the film just above the photoelectric conversion portion can be prevented, whereas this is a problem with respect to the silicon oxynitride film.

A method for manufacturing a solid-state imaging device including a pixel portion provided with a photoelectric conversion portion, which photoelectrically converts incident light to obtain an electric signal, and a peripheral circuit portion disposed on the periphery of the pixel portion, in a semiconductor substrate, according to an embodiment of the present invention, includes the steps of forming a gate insulating film composed of a silicon oxynitride film all over the above-described semiconductor substrate, forming gate electrodes of the MOS transistors disposed in the above-described pixel portion and the above-described peripheral circuit portion, on the above-described gate insulating film, and removing the above-described gate insulating film from regions other than the regions which are just below the above-described individual gate electrodes and in which the above-described gate insulating films are left.

In the method for manufacturing a solid-state imaging device according to an embodiment of the present invention, the gate electrodes of the MOS transistors disposed in the peripheral circuit portion and the pixel portion are formed from the silicon oxynitride film. Therefore, generation of a tunnel current is prevented. Furthermore, since the silicon oxynitride film just above the photoelectric conversion portion is removed, deterioration in white defect and dark current due to a fixed charge in the silicon oxynitride film can be prevented.

An imaging apparatus according to an embodiment of the present invention includes a light-condensing optical portion to condense incident light, a solid-state imaging device to receive and photoelectrically convert the light condensed with the above-described light-condensing optical portion, and a signal processing portion to process the signal subjected to the photoelectrical conversion, wherein the above-described solid-state imaging device includes, in a semiconductor substrate, a pixel portion provided with a photoelectric conversion portion, which photoelectrically converts incident light to obtain an electric signal and a peripheral circuit portion disposed on the periphery of the above-described pixel portion, a gate insulating film of a MOS transistor in the above-described peripheral circuit portion is composed of a silicon oxynitride film, a gate insulating film of a MOS transistor in the above-described pixel portion is composed of a silicon oxynitride film, and an oxide film is disposed just above the photoelectric conversion portion in the above-described pixel portion.

The imaging device according to an embodiment of the present invention includes the solid-state imaging device according to an embodiment of the present invention. Therefore, the MOS transistor in the peripheral circuit portion can be made finer, so that the performance is improved. Moreover, deterioration in white defect and dark current of the photoelectric conversion portion in each pixel can be prevented.

Regarding the solid-state imaging device according to an embodiment of the present invention, generation of a tunnel current is prevented, so that the transistor characteristics of the peripheral circuit portion and the pixel portion are improved. Furthermore, since deterioration in white defect and dark current due to a fixed charge in the photoelectric conversion portion can be prevented, there is an advantage that the image quality is improved.

Regarding the method for manufacturing a solid-state imaging device according to an embodiment of the present invention, generation of a tunnel current is prevented, so that the transistor characteristics of the peripheral circuit portion and the pixel portion are improved. Furthermore, since deterioration in white defect and dark current due to a fixed charge in the photoelectric conversion portion can be prevented, there is an advantage that the image quality is improved.

Regarding the imaging device according to an embodiment of the present invention, since the solid-state imaging device according to an embodiment of the present invention is included, the MOS transistor in the peripheral circuit portion can be made finer, so that the performance is improved. Moreover, since deterioration in white defect and dark current in the photoelectric conversion portion in each pixel can be prevented, there is an advantage that the image quality is improved.

BRIEF DESCRIPTION OF THE DRAWINGS

FIG. 35 is a sectional view showing a production step of a method for manufacturing a solid-state imaging device according to an embodiment of the present invention;

DESCRIPTION OF THE PREFERRED EMBODIMENTS

Figure 1:
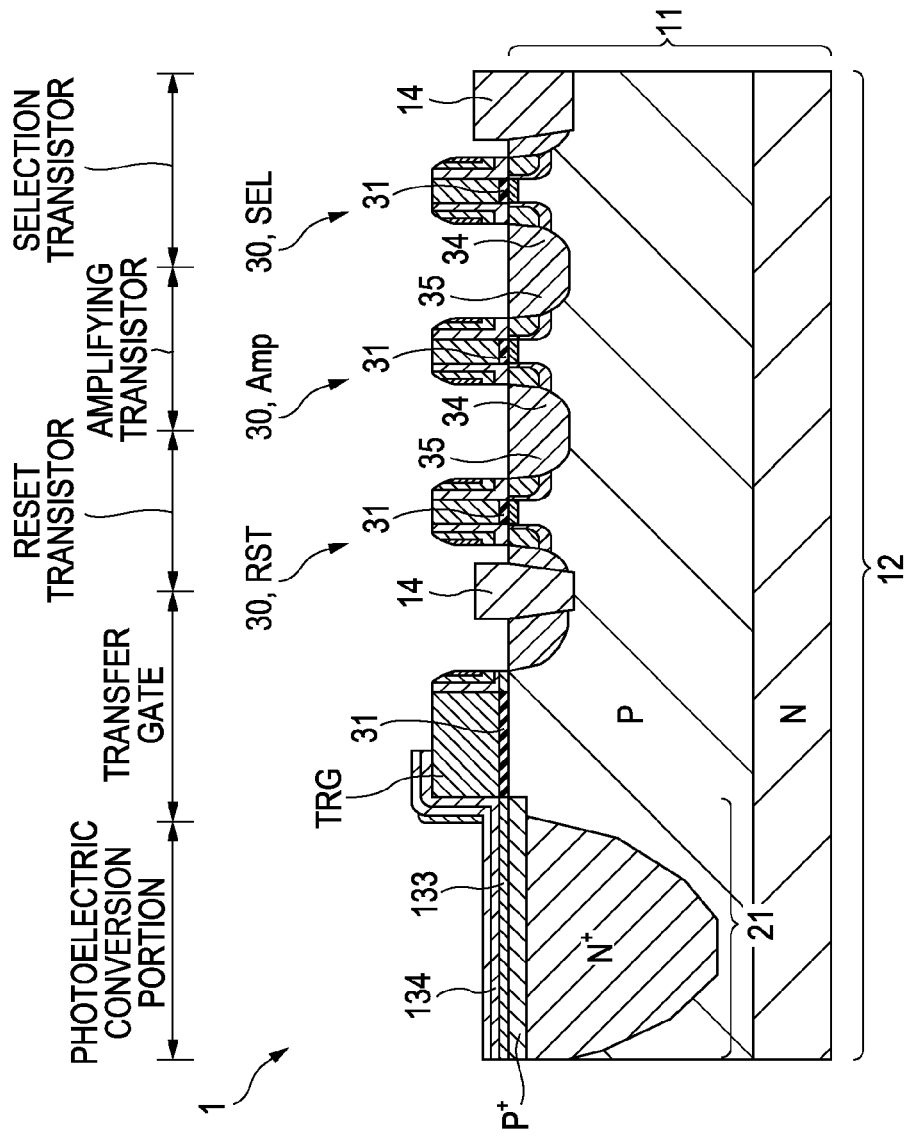
FIG. 1 is a schematic configuration sectional view showing a first example of a solid-state imaging device according to an embodiment of the present invention.
Figure 2:
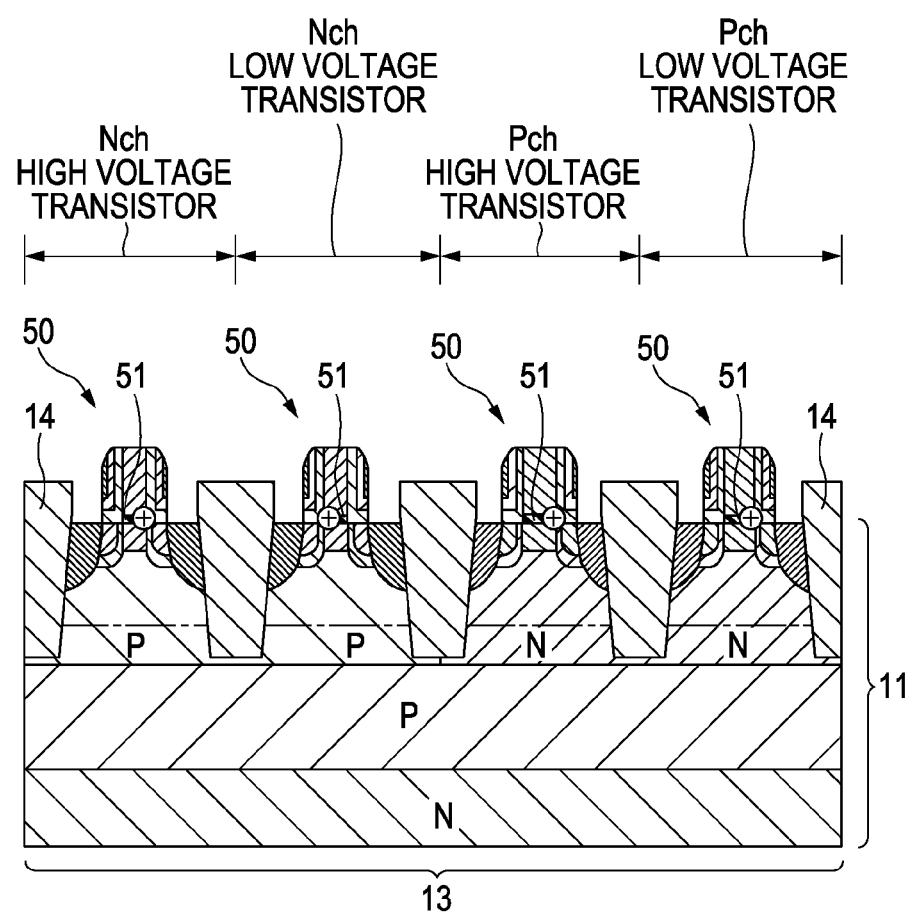
FIG. 2 is a schematic configuration sectional view showing the first example of the solid-state imaging device according to an embodiment of the present invention.

A first example of a solid-state imaging device according to an embodiment of the present invention will be described with reference to a schematic configuration sectional view of a pixel portion as shown in FIG. 1 and a schematic configuration sectional view of a peripheral circuit portion as shown in FIG. 2. The pixel portion shown in FIG. 1 and the peripheral circuit portion shown in FIG. 2 are disposed in the same semiconductor substrate.

As shown in FIG. 1 and FIG. 2, a semiconductor substrate 11 includes a pixel portion 12 provided with a photoelectric conversion portion 21, which photoelectrically converts incident light to obtain an electric signal, and a peripheral circuit portion 13 disposed on the periphery of the pixel portion 12. The above-described pixel portion 12 and the peripheral circuit portion 13 are isolated by an element isolation region 14.

In the semiconductor substrate 11 of the above-described pixel portion 12, the photoelectric conversion portion 21 is disposed. A transfer gate TRG, a reset transistor RST, an amplifying transistor Amp, and a selection transistor SEL are sequentially disposed in series while being connected to the photoelectric conversion portion 21. The above-described photoelectric conversion portion 21 is formed from, for example, a photodiode.

Furthermore, the above-described transfer gate TRG and pixel transistors, i.e. the reset transistor RST, the amplifying transistor Amp, and the selection transistor SEL, are isolated by an element isolation region 14.

Therefore, a source-drain region 34 of the above-described amplifying transistor Amp is formed as a diffusion layer common to a source-drain region 35 of the reset transistor RST, and a source-drain region 35 of the above-described amplifying transistor Amp is formed as a diffusion layer common to a source-drain region 34 of the selection transistor SEL.

In this regard, no element isolation region 14 may be disposed between the above-described transfer gate TRG and the above-described reset transistor RST, and a diffusion layer common to the above-described transfer gate TRG and the above-described reset transistor RST may be disposed.

Furthermore, regarding a group of transistors in the above-described pixel portion 12, although not shown in the drawing, a transfer gate TRG, a selection transistor SEL, an amplifying transistor Amp, and a reset transistor RST may be sequentially disposed in series while being connected to the above-described photoelectric conversion portion 21.

A gate insulating film 31 of each of the above-described transfer gate TRG, the reset transistor RST, the amplifying transistor Amp, and the selection transistor SEL, which are MOS transistors 30 in the above-described pixel portion 12, is composed of a silicon oxynitride film.

Moreover, an insulating film 51 of each MOS transistor in the above-described peripheral circuit portion 13 is composed of a silicon oxynitride film.

This silicon oxynitride film has a positive fixed charge in the film as compared with that in a silicon oxide film.

A silicon oxynitride film is not disposed just above the photoelectric conversion portion 21 in the above-described pixel portion 12, but, for example, silicon oxide films serving as an oxide film 133 and an oxide film 134 are disposed.

Figure 3:
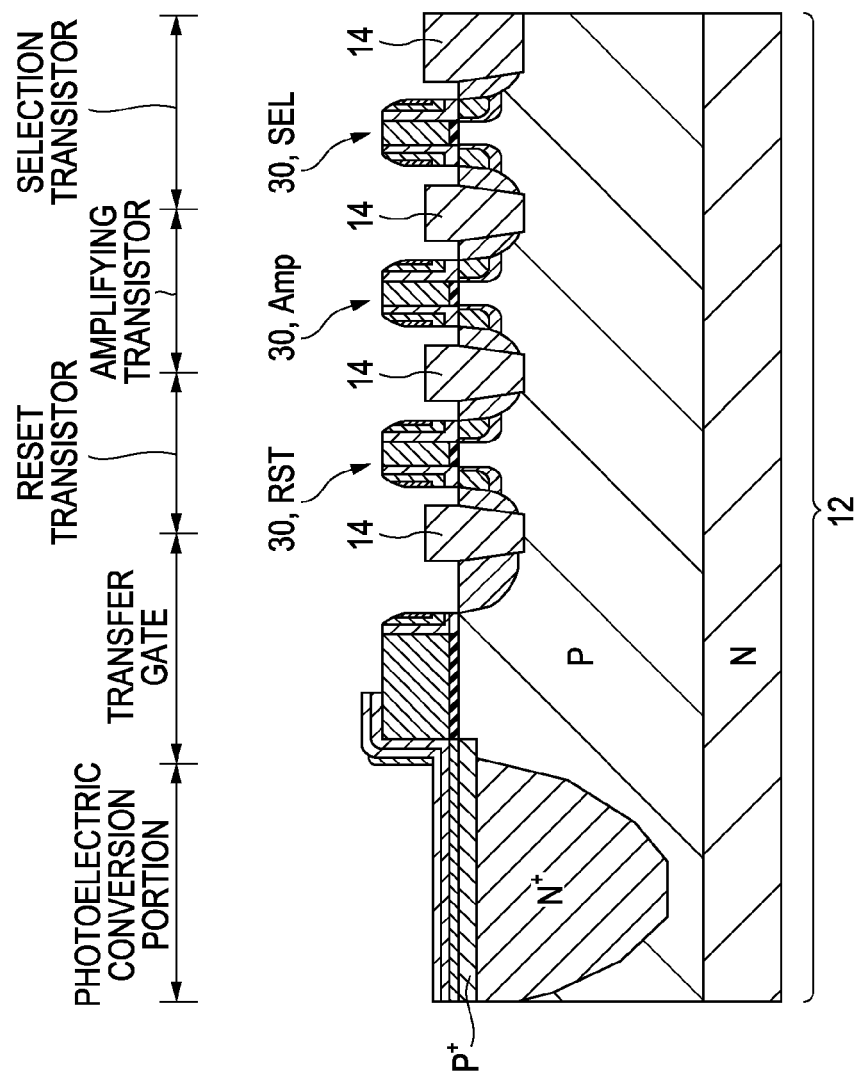
FIG. 3 is a schematic configuration sectional view showing a modified example of the first example of the solid-state imaging device according to an embodiment of the present invention.

In this regard, as is indicated by a schematic configuration sectional view shown in FIG. 3, a reset transistor RST, an amplifying transistor Amp, and a selection transistor SEL, which are MOS transistors 30 in the pixel portion 12, may be isolated by element isolation regions 14. In this case, the arrangement of the transistors does not have to follow the above-described order.

In the above-described solid-state imaging device 1, the gate insulating films 51 and 31 of the individual MOS transistors 50 and 30 in the peripheral circuit portion 13 and the pixel portion 12 are composed of silicon oxynitride films. Therefore, an increase in tunnel current can be suppressed. Furthermore, since the oxide film 133 and the oxide film 134 instead of a silicon oxynitride film are disposed just above the photoelectric conversion portion 21, deterioration in white defect due to a fixed charge in the film just above the photoelectric conversion portion 21 can be prevented, whereas this is a problem with respect to the silicon oxynitride film.

Figure 4:
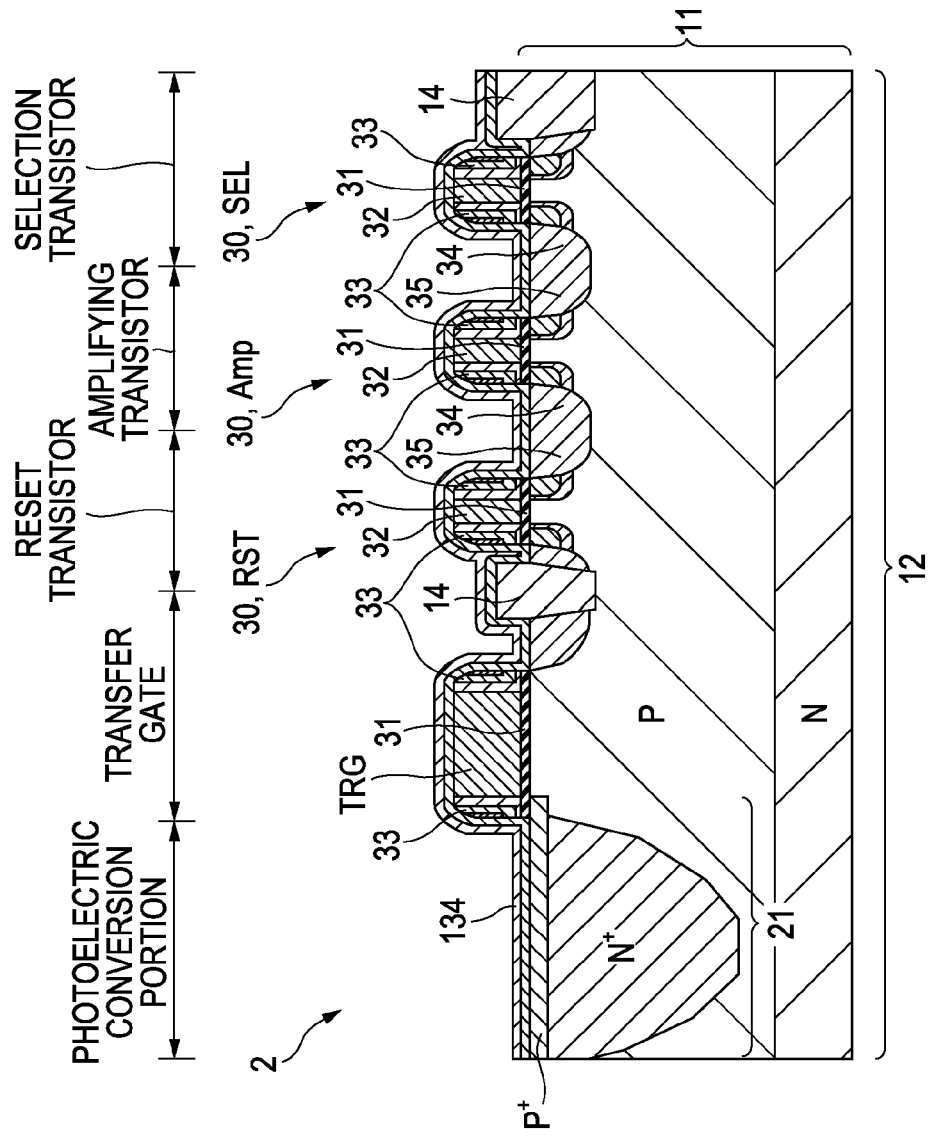
FIG. 4 is a schematic configuration sectional view showing a second example of the solid-state imaging device according to an embodiment of the present invention.
Figure 5:
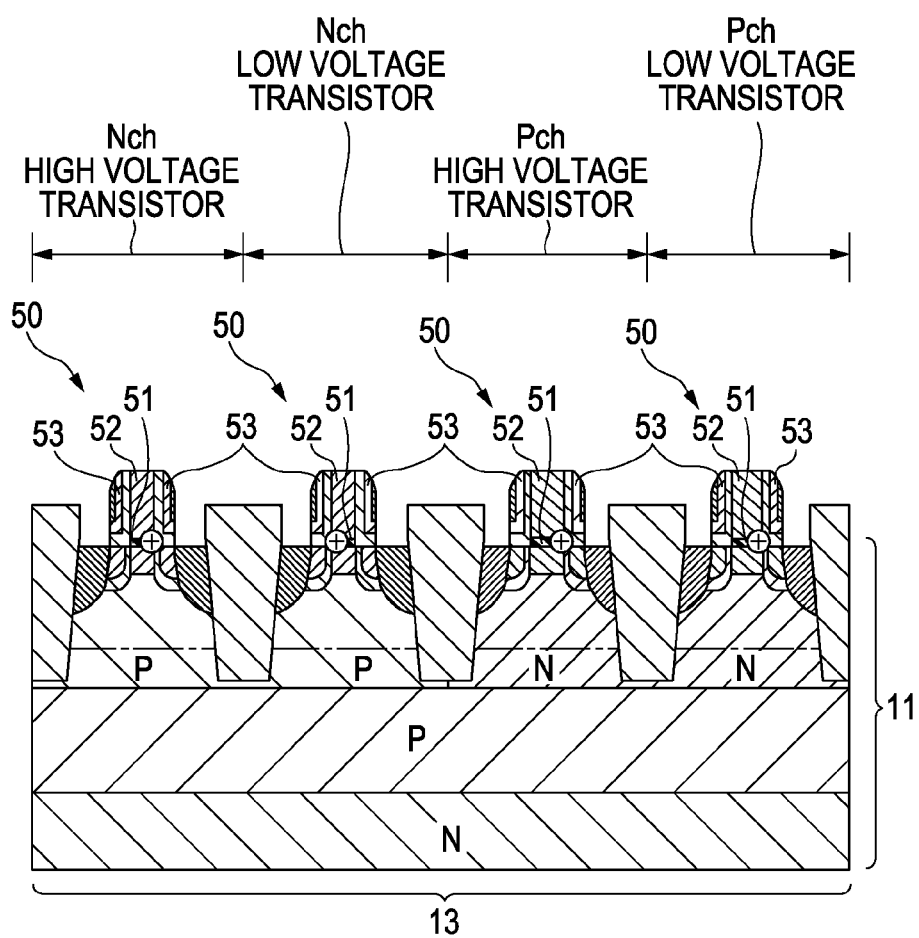
FIG. 5 is a schematic configuration sectional view showing the second example of the solid-state imaging device according to an embodiment of the present invention.

Next, a second example of a solid-state imaging device according to an embodiment of the present invention will be described with reference to a schematic configuration sectional view of a pixel portion as shown in FIG. 4 and a schematic configuration sectional view of a peripheral circuit portion as shown in FIG. 5. The pixel portion shown in FIG. 4 and the peripheral circuit portion shown in FIG. 5 are disposed in the same semiconductor substrate.

As shown in FIG. 4 and FIG. 5, a semiconductor substrate 11 includes a pixel portion 12 provided with a photoelectric conversion portion 21, which photoelectrically converts incident light to obtain an electric signal, and a peripheral circuit portion 13 disposed on the periphery of the pixel portion 12.

In the semiconductor substrate 11 in the above-described pixel portion 12, the photoelectric conversion portion 21 is disposed. A transfer gate TRG, a reset transistor RST, an amplifying transistor Amp, and a selection transistor SEL are sequentially disposed in series while being connected to the photoelectric conversion portion 21. The above-described photoelectric conversion portion 21 is formed from, for example, a photodiode.

Furthermore, the above-described transfer gate TRG and pixel transistors, i.e. the reset transistor RST, the amplifying transistor Amp, and the selection transistor SEL, are isolated by an element isolation region 14.

Therefore, a source-drain region 34 of the above-described amplifying transistor Amp serves as a diffusion layer common to a source-drain region 35 of the reset transistor RST, and a source-drain region 35 of the above-described amplifying transistor Amp serves as a diffusion layer common to a source-drain region 34 of the selection transistor SEL.

In this regard, no element isolation region 14 may be disposed between the above-described transfer gate TRG and the above-described reset transistor RST, and a diffusion layer common to the above-described transfer gate TRG and the above-described reset transistor RST may be disposed.

Furthermore, regarding a group of transistors in the above-described pixel portion 12, although not shown in the drawing, a transfer gate TRG, a selection transistor SEL, an amplifying transistor Amp, and a reset transistor RST may be sequentially disposed in series while being connected to the above-described photoelectric conversion portion 21.

A gate insulating film 31 of each of the above-described transfer gate TRG, the reset transistor RST, the amplifying transistor Amp, and the selection transistor SEL, which are MOS transistors 30 in the above-described pixel portion 12 is composed of a silicon oxynitride film. This gate insulating film 31 is also disposed just below a first sidewall 33 disposed on the side of each gate electrode 32.

Moreover, an insulating film 51 of each MOS transistor in the above-described peripheral circuit portion 13 is composed of a silicon oxynitride film. This gate insulating film 51 is also disposed just below a second sidewall 53 disposed on the side of each gate electrode 52.

This silicon oxynitride film has a positive fixed charge in the film as compared with that in a silicon oxide film.

A silicon oxynitride film is not disposed just above the photoelectric conversion portion 21 in the above-described pixel portion 12, but, for example, a silicon oxide film serving as an oxide film 134 is disposed.

Figure 6:
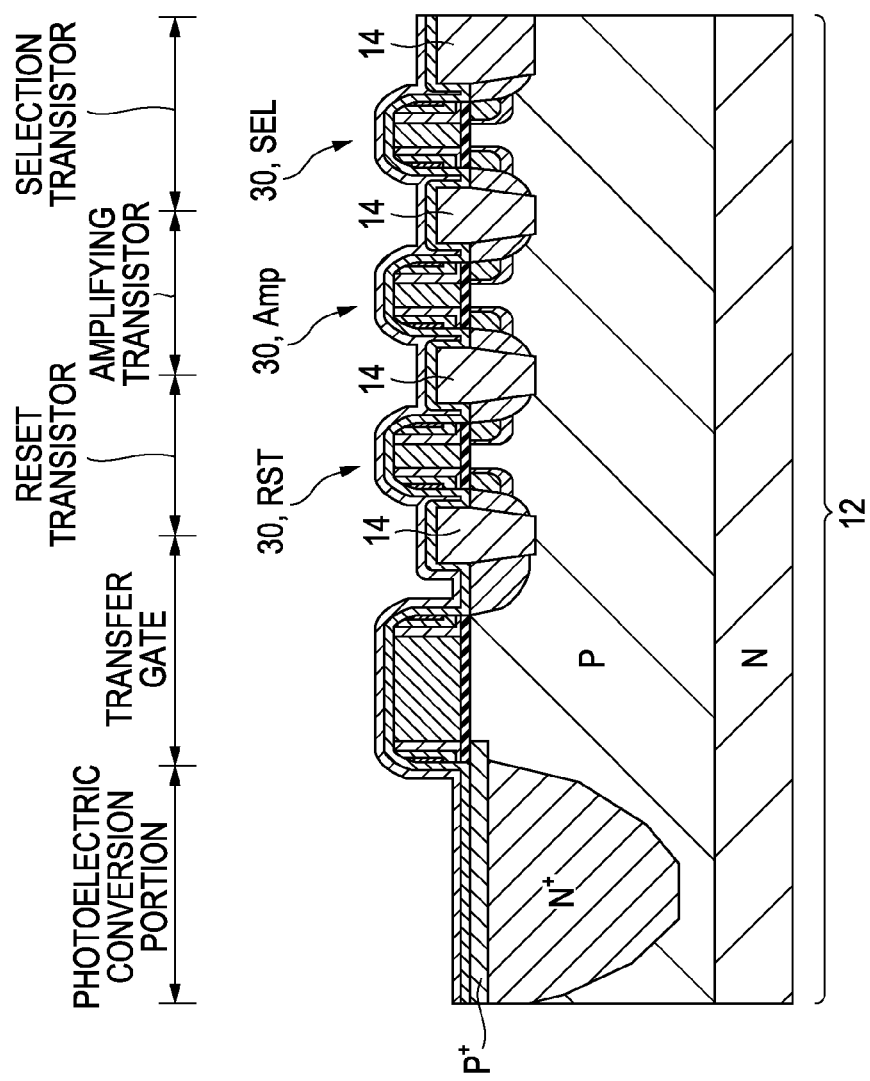
FIG. 6 is a schematic configuration sectional view showing a modified example of the second example of the solid-state imaging device according to an embodiment of the present invention.

In this regard, as is indicated by a schematic configuration sectional view shown in FIG. 6, a reset transistor RST, an amplifying transistor Amp, and a selection transistor SEL, which are MOS transistors 30 in the pixel portion 12, may be isolated by element isolation regions 14. In this case, the arrangement of the transistors is not necessarily follow the above-described order.

In the above-described solid-state imaging device 2, the gate insulating films 51 and 31 of the individual MOS transistors 50 and 30 in the peripheral circuit portion 13 and the pixel portion 12 are composed of silicon oxynitride films. Therefore, an increase in tunnel current can be suppressed. Furthermore, since the oxide film 134 instead of a silicon oxynitride film is disposed just above the photoelectric conversion portion 21, deterioration in white defect and dark current due to a fixed charge in the film just above the photoelectric conversion portion 21 can be prevented, whereas this is a problem with respect to the silicon oxynitride film.

In this regard, in the solid-state imaging device 2, gate insulating films 31 and 51 composed of silicon oxynitride films remain just below the individual first and second sidewalls 33 and 53. Consequently, it is feared that deterioration in white defect due to a positive fixed charge at an edge of the transfer gate TRG occurs to some extent as compared with that of the solid-state imaging device 1 of the above-described first example. However, deterioration in white defect due to a fixed charge can be suppressed as compared with a solid-state imaging device in the related art.

Next, a method for manufacturing a solid-state imaging device according to an embodiment of the present invention will be described with reference to sectional views of production steps shown in FIG. 7 to FIG. 40.

Figure 7:
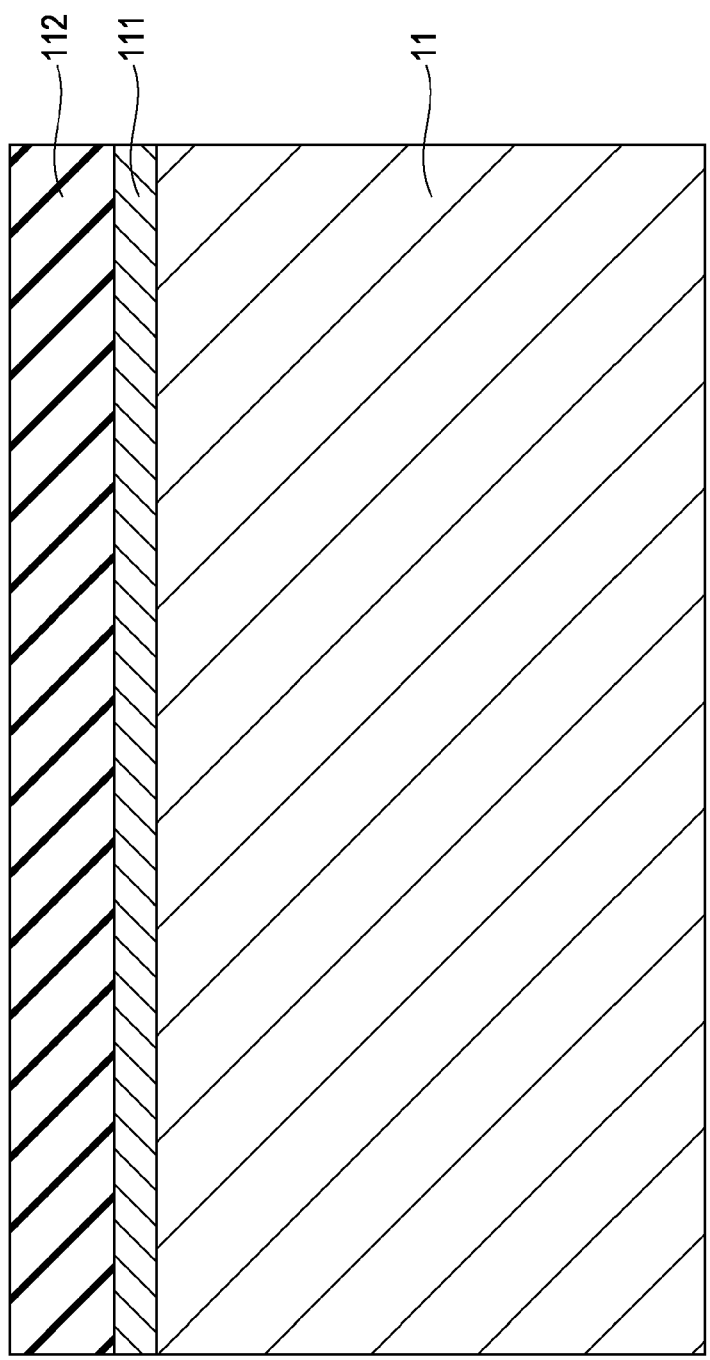
FIG. 7 is a sectional view showing a production step of a method for manufacturing a solid-state imaging device according to an embodiment of the present invention.

As shown in FIG. 7, for example, a silicon substrate is used as a semiconductor substrate 11.

A pad oxide film 111 and a silicon nitride film 112 are formed on the above-described semiconductor substrate 11.

The above-described pad oxide film 111 is formed through oxidation of a surface of the semiconductor substrate 11 by, for example, a thermal oxidation method. This pad oxide film 111 is formed having a thickness of, for example, 15 nm.

Subsequently, the silicon nitride film 112 is formed on the above-described pad oxide film 111 by, for example, a low pressure CVD (LP-CVD) method. This silicon nitride film 112 is formed having a thickness of, for example, 160 nm.

In the above-described configuration, the structure is silicon nitride film/pad oxide film. However, the structure may be silicon nitride film/polysilicon film or amorphous silicon film/pad oxide film.

Figure 8:
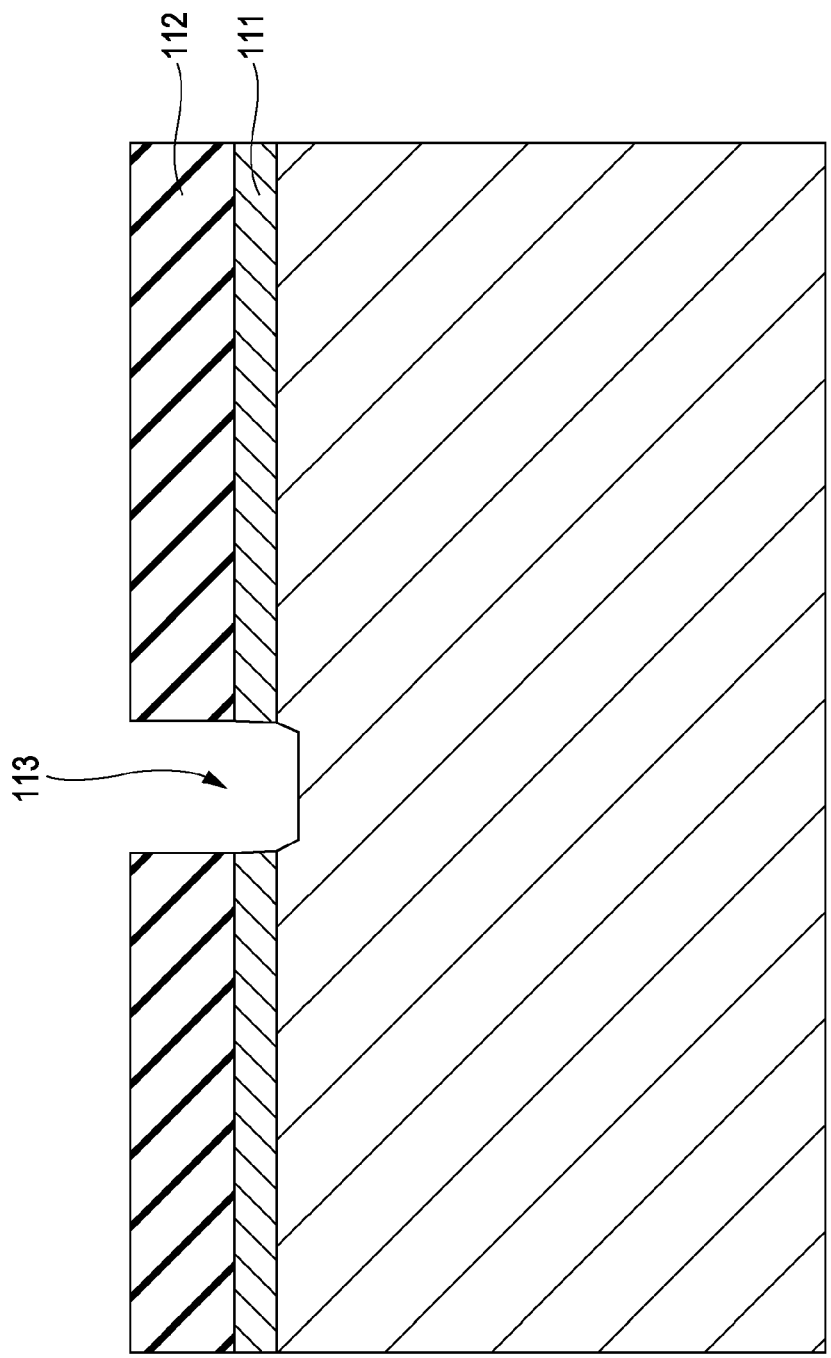
FIG. 8 is a sectional view showing a production step of a method for manufacturing a solid-state imaging device according to an embodiment of the present invention.

Then, as shown in FIG. 8, on the above-described silicon nitride film 112, a resist mask (not shown in the drawing) is formed having an opening portion in a region in which an element isolation region is formed. Thereafter, an opening portion 113 is formed in the above-described silicon nitride film 112 and the above-described pad oxide film 111 through etching.

Regarding the above-described etching, for example, a reactive ion etching (RIE) apparatus, an electron cyclotron resonance (ECR) etching apparatus, or the like can be used. After the working, the above-described resist mask is removed with an ashing apparatus or the like.

Figure 9:
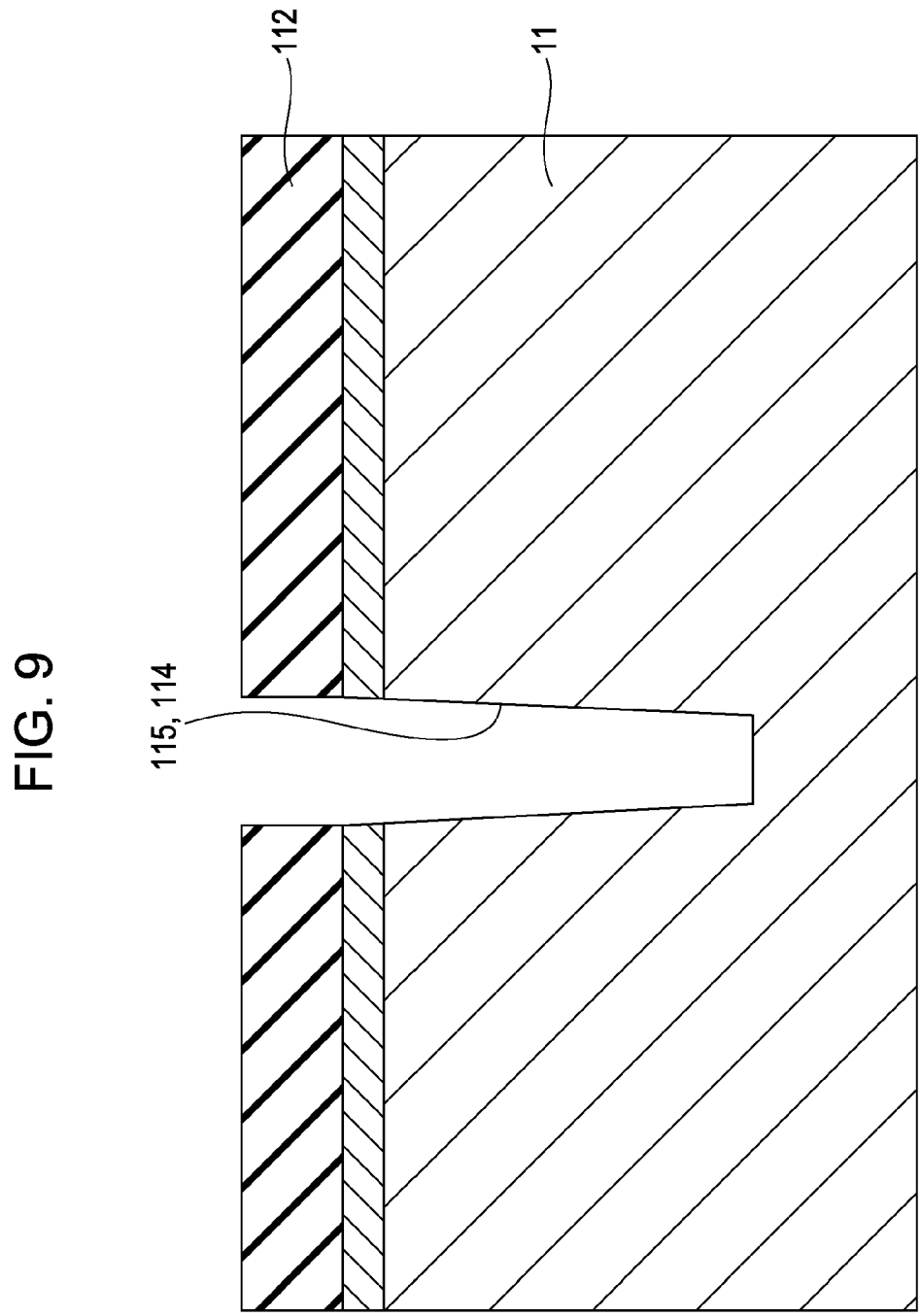
FIG. 9 is a sectional view showing a production step of a method for manufacturing a solid-state imaging device according to an embodiment of the present invention.

Next, as shown in FIG. 9, element isolation trenches (first element isolation trench 114 and second element isolation trench 115) are formed in the above-described semiconductor substrate 11 by using the above-described silicon nitride film 112 as an etching mask. In this etching, for example, an RIE apparatus, an ECR etching apparatus, or the like is used.

Initially, first etching of the second element isolation trench 115 (and the first element isolation trench 114) in the peripheral circuit portion (and pixel portion) is conducted. At this time, the depth of each of the first and the second element isolation trenches 114 and 115 is 50 nm to 160 nm.

Although not shown in the drawing, a resist mask is formed on the pixel portion, and regarding only the peripheral circuit portion, second etching is further conducted to extend the element isolation trench 115 in such a way that the depth of the second element isolation trench 115 in only the peripheral circuit portion becomes, for example, 0.3 µm. Then, the resist mask is removed.

As described above, the depth of the first element isolation trench 114 in the pixel portion is made small and, thereby, an effect of suppressing an occurrence of white defect due to etching damage is exerted. Since the depth of the first element isolation trench 114 is made small, an effective area of the photoelectric conversion portion increases and, thereby, there is an effect of increasing the amount of saturation charge (Qs). In order to realize a high-speed operation, a parasitic capacitance between the wiring and the substrate is reduced by increasing the STI depth of the second element isolation region in the peripheral circuit portion.

Subsequently, although not shown in the drawing, a liner film is formed. This liner film is formed through thermal oxidation at, for example, 800° C. to 900° C. The above-described liner film may be a silicon oxide film, a nitrogen-containing silicon oxide film, or a CVD silicon nitride film. The film thickness thereof is specified to be about 4 nm to 10 nm.

Although not shown in the drawing, in order to suppress a dark current, boron (B) ions are implanted into the pixel portion 12 by using a resist mask. As for an example of the ion implantation condition, the implantation energy is set at about 10 keV, and the amount of dose is set at $1 \times 10^{12}/cm^2$ to $1 \times 10^{14}/cm^2$. As the boron concentration around the first element isolation trench 114, in which the element isolation region is formed, in the pixel portion increases, a dark current is suppressed, and a parasitic transistor operation is suppressed. However, if the boron concentration becomes too high, the area of photodiode, in which the photoelectric conversion portion is formed, becomes small, the amount of saturation charge (Qs) becomes small. Therefore, the boron concentration is specified to be the above-described amount of dose.

Figure 10:
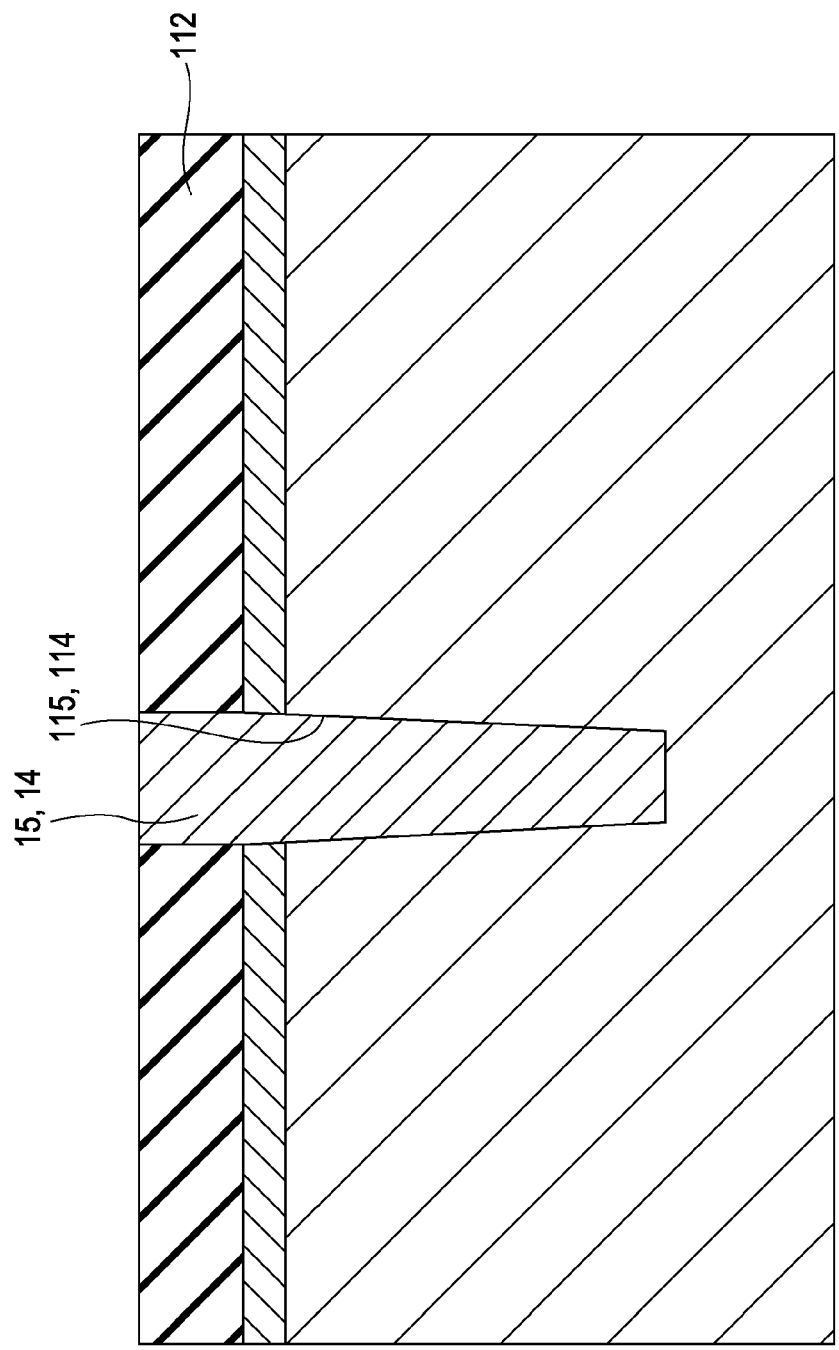
FIG. 10 is a sectional view showing a production step of a method for manufacturing a solid-state imaging device according to an embodiment of the present invention.

Next, as shown in FIG. 10, an insulating film is formed on the above-described silicon nitride film 112 in such a way as to fill the inside of the above-described second element isolation trench 115 (and the first element isolation trench 114). This insulating film is formed through deposition of silicon oxide by, for example, a high-density plasma CVD method.

Thereafter, an excess insulating film on the above-described silicon nitride film 112 is removed through, for example, chemical mechanical polishing (CMP) while the insulating film is left in the inside of the second element isolation trench 115 (and the first element isolation trench 114), so as to form the second element isolation region 15 (first element isolation region 14) from the above-described insulating film. In the above-described CMP, the silicon nitride film 112 serves as a stopper and terminates the CMP.

The first element isolation region 14 is formed to become shallower than the second element isolation region 15 in the peripheral circuit portion 13. However, since the stopper is the same silicon nitride film 112, the amount of protrusion for element isolation is specified to be equal to that of the second element isolation region 15. Here, regarding the amount of protrusion of the first element isolation region 14 and the amount of protrusion of the second element isolation region 15, the amounts of protrusion within the range of working variations based on the production working precision are determined to be equal. That is, regarding the film thickness of the silicon nitride film 112 used as the mask in trench working, in general, the wafer in-plane variations are about 10% with respect to a silicon nitride film having a thickness of about 160 nm. Polishing variations through chemical mechanical polishing (CMP) are about ±20 nm to ±30 nm. Therefore, even if it is devised in such a way that variations in the pixel portion and variations in the peripheral circuit portion become equal, variations of 20 nm to 30 nm may occur. Consequently, in the case where the pixel portion and the peripheral circuit portion are compared at any place in a chip surface through strict observation and a difference in height of protrusion between the pixel portion and the peripheral circuit portion is within 30 nm even when the heights of protrusion are not completely equal, the heights are assumed to be equal in the present invention.

Finally, the heights of protrusion of the first element isolation region 14 and the second element isolation region 15 are set at a low level of, for example, about 0 to 20 nm from a silicon surface.

Figure 11:
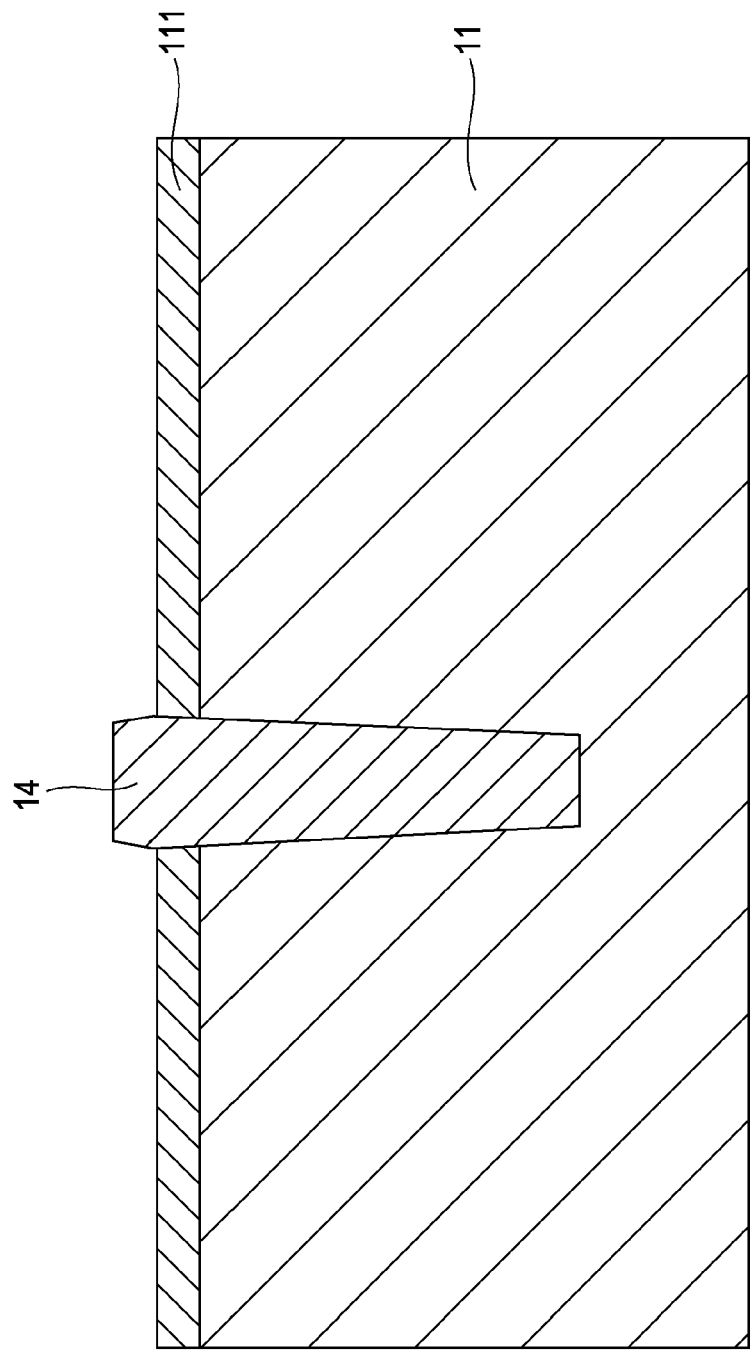
FIG. 11 is a sectional view showing a production step of a method for manufacturing a solid-state imaging device according to an embodiment of the present invention.

Next, as shown in FIG. 11, in order to adjust the height of the first element isolation region 14 from the surface of the semiconductor substrate 11, wet etching of the oxide film is conducted. The amount of etching of the oxide film is specified to be, for example, 40 nm to 100 nm.

Subsequently, the above-described silicon nitride film 112 (refer to FIG. 10) is removed so as to expose the pad oxide film 111. The above-described silicon nitride film 112 is removed through, for example, wet etching with hot phosphoric acid.

Figure 12:
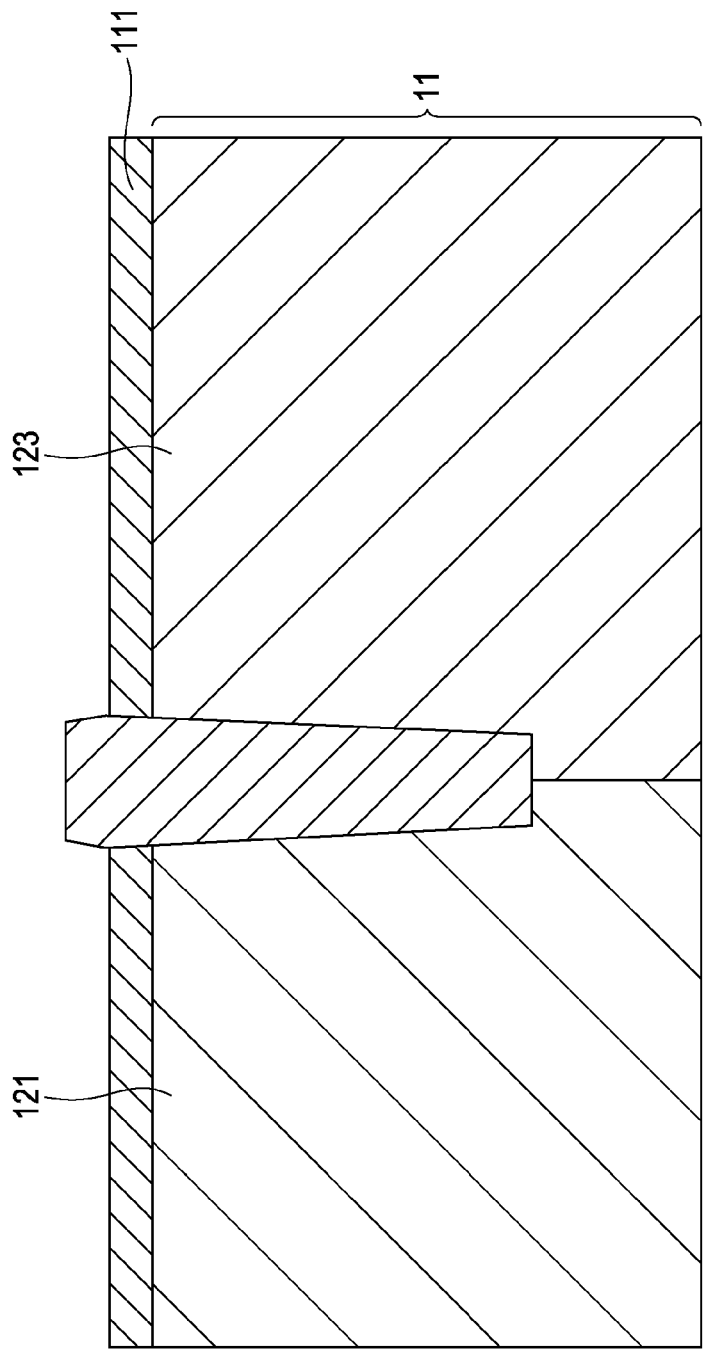
FIG. 12 is a sectional view showing a production step of a method for manufacturing a solid-state imaging device according to an embodiment of the present invention.

Then, as shown in FIG. 12, in the state in which the pad oxide film 111 is disposed, a p-well 121 is formed in the semiconductor substrate 11 through ion implantation by using a resist mask (not shown in the drawing) provided with an opening portion above a region in which the p-well is formed. Furthermore, channel ion implantation is conducted. Thereafter, the above-described resist mask is removed.

Moreover, in the state in which the pad oxide film 111 is disposed, an n-well 123 is formed in the semiconductor substrate 11 through ion implantation by using a resist mask (not shown in the drawing) provided with an opening portion above a region in which the n-well is formed. Furthermore, channel ion implantation is conducted. Thereafter, the above-described resist mask is removed.

The ion implantation of the above-described p-well 121 is conducted by using boron (B) as an ion implantation species while the implantation energy is set at, for example, 200 keV and the amount of dose is set at, for example, $1 \times 10^{13}$ cm$^{-2}$. The channel ion implantation of the above-described p-well 121 is conducted by using boron (B) as an ion implantation species while the implantation energy is set at, for example, 10 keV to 20 keV and the amount of dose is set at, for example, $1 \times 10^{11}$ cm$^{-2}$ to $1 \times 10^{13}$ cm$^{-2}$.

The ion implantation of the above-described n-well 123 is conducted by using, for example, phosphorus (P) as an ion implantation species while the implantation energy is set at, for example, 200 keV and the amount of dose is set at, for example, $1 \times 10^{13}$ cm$^{-2}$. The channel ion implantation of the above-described n-well 123 is conducted by using arsenic (As) as an ion implantation species while the implantation energy is set at, for example, 100 keV and the amount of dose is set at, for example, $1 \times 10^{11}$ cm$^{-2}$ to $1 \times 10^{13}$ cm$^{-2}$.

Moreover, although not shown in the drawing, ion implantation for forming a photodiode in the photoelectric conversion portion is conducted so as to form a p-type region. For example, boron (B) is ion-implanted into the surface of the semiconductor substrate in which the photoelectric conversion portion is formed, arsenic (As) or phosphorus (P) is ion-implanted into a deeper region so as to form an n-type region joined to a lower portion of the above-described p-type region. In this manner, a pn-junction photoelectric conversion portion is formed.

Figure 13:
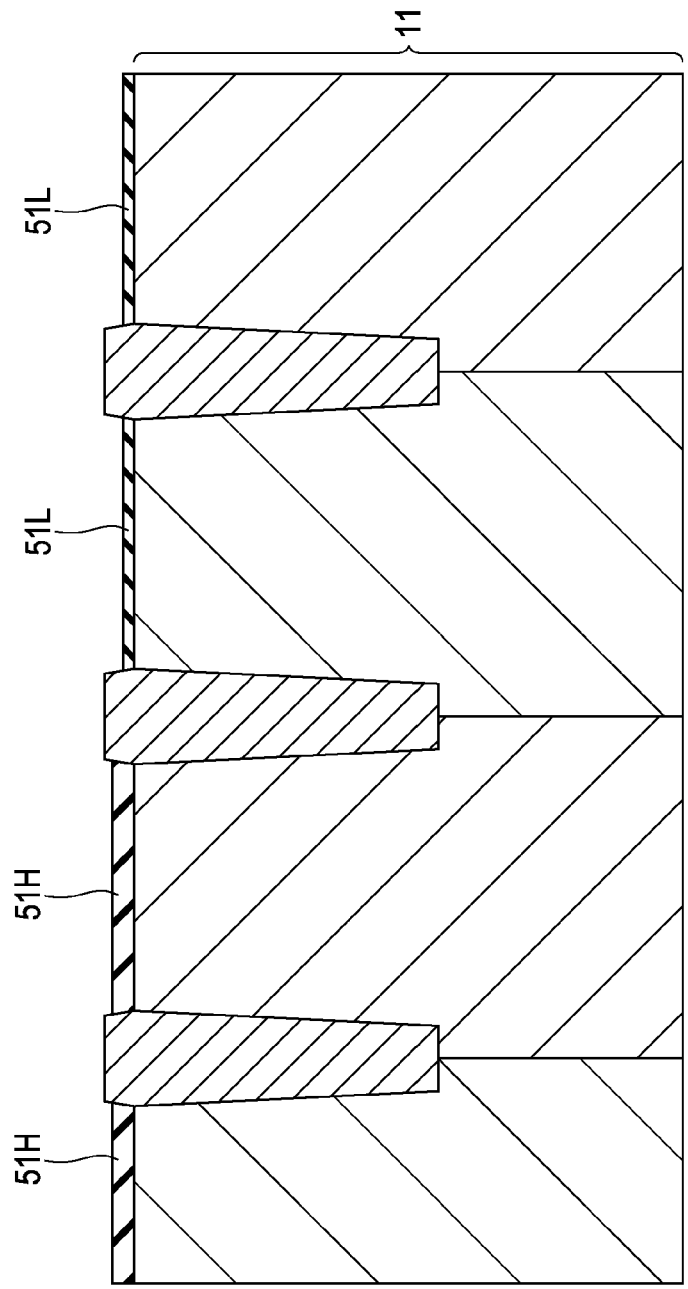
FIG. 13 is a sectional view showing a production step of a method for manufacturing a solid-state imaging device according to an embodiment of the present invention.

Next, as shown in FIG. 13, the pad oxide film 111 (refer to FIG. 12) is removed through, for example, wet etching.

Subsequently, a thick gate insulating film 51H for high voltages is formed on the semiconductor substrate 11. The film thickness is about 7.5 nm with respect to a transistor for a supply voltage of 3.3 V and about 5.5 nm with respect to a transistor for 2.5 V. Thereafter, a resist mask (not shown in the drawing) is formed on the thick gate insulating film 51H for high voltages, and the thick gate insulating film 51H formed on transistor regions for low voltages is removed.

After the above-described resist mask is removed, thin gate insulating films 51L are formed in the regions of transistor for low voltages on the semiconductor substrate 11. The film thickness of a transistor for a supply voltage of 1.0 V is specified to be about 1.2 nm to 1.8 nm. At the same time, thin gate insulating films (not shown in the drawing) are formed from a silicon oxynitride film also in the transistor-forming regions in the pixel portion.

This silicon oxynitride film has a positive fixed charge in the film as compared with that in a silicon oxide film.

The above-described silicon oxynitride film is formed in an atmosphere containing nitrogen atoms to become, for example, dinitrogen monoxide ($N_2O$), nitrogen monoxide (NO), or nitrogen dioxide ($NO_2$). For example, a thermal oxidation and plasma nitridation method, a thermal oxynitridation method, or the like is adopted. In this regard, if the silicon substrate is simply directly subjected to thermal nitridation, there is a merit in reducing the number of steps, but a lot of nitrogen is distributed at a silicon (Si) interface, so that the device performance deteriorates. Furthermore, deterioration of the mobility is invited along with an increase in interface state. Therefore, film formation by the thermal oxidation and plasma nitridation method is preferable.

Moreover, there is a problem in that NBTI of PMOS deteriorates and reduction in reliability may be invited. In this regard, an oxide film of a high-voltage transistor is increased by this silicon oxynitride film, and nitrogen is introduced, so that a positive fixed charge may be generated as well.

The above-described positive fixed charge shifts the threshold voltage Vth of an nMOSFET to a lower level and the threshold voltage Vth of a pMOSFET to a higher level as compared with that in the case where the gate insulating film is formed from a pure oxide film.

In addition, in the case where the gate insulating film is specified to be the silicon oxynitride film, the physical film thickness increases, but the dielectric constant increases, so that electrical, equivalent oxide film thickness decreases and the gate leakage current can be reduced.

Moreover, in the case where polysilicon is used for the gate electrode of the pMOSFET, there is an effect of preventing boron (B) in the gate electrode from penetrating the gate insulating film and suppressing variations in the characteristics of the pMOSFET.

The above-described silicon oxynitride film is used in the generation of a film thickness of 3.5 nm or less and a gate length of 0.18 μm or less. Such a silicon oxynitride film has a high nitrogen concentration at a silicon (Si) interface and, therefore, a method in which common thermal oxidation is conducted and plasma nitriding is conducted in such a way that the nitrogen concentration in the vicinity of a thermal oxidation film surface becomes high and the concentration at the silicon (Si) interface is minimized is preferable. The film quality is improved through RTA immediately after the plasma nitriding.

In general, the method through plasma nitriding is used in the generation of a film thickness of 2.5 nm or less and a gate length of 0.15 μm or less. The characteristics of the imaging element can be improved to a great extent by a method in which a thermal oxidation film is formed and, thereafter, plasma nitriding is conducted as compared with that by a method in which a silicon substrate is directly nitrided and oxidized to form a silicon oxynitride film.

Hereafter, in the drawings, the thick gate insulating film 51H and the thin gate insulating film 51L are drawn having the same film thickness for the sake of convenience.

Figure 14:
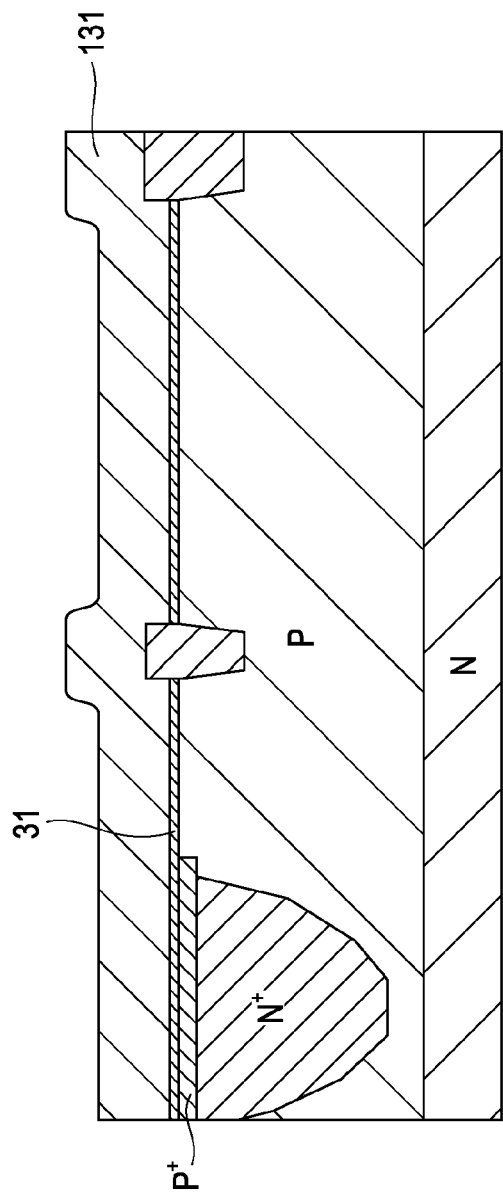
FIG. 14 is a sectional view showing a production step of a method for manufacturing a solid-state imaging device according to an embodiment of the present invention.
Figure 15:
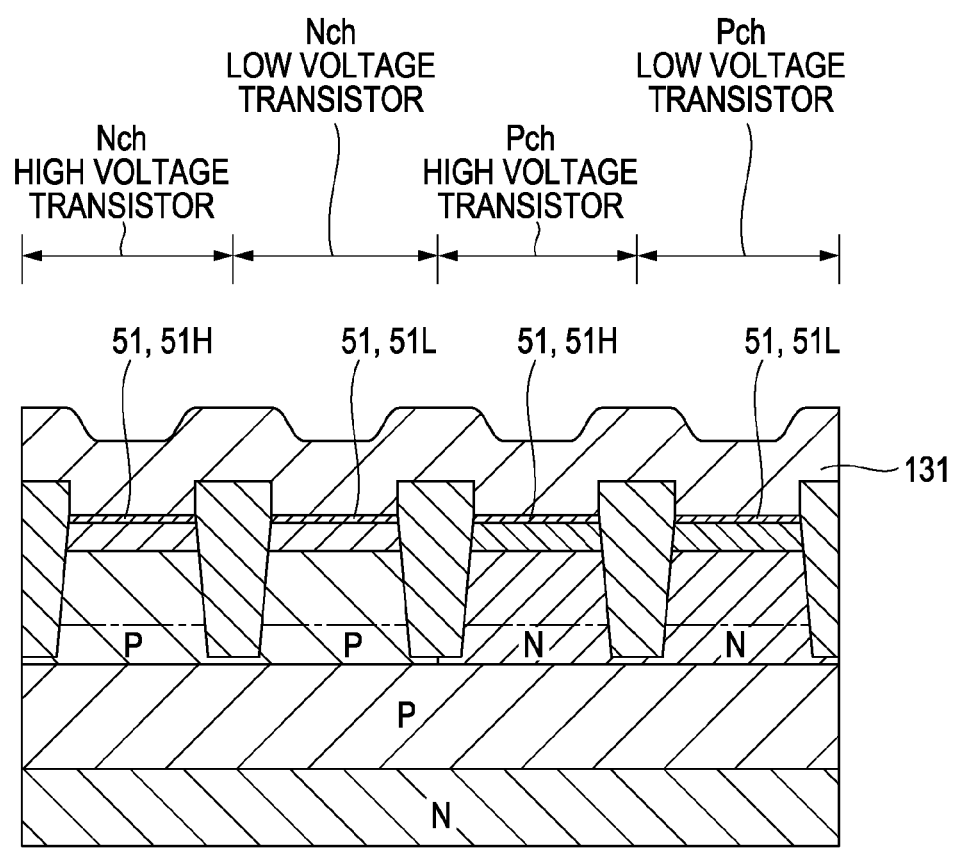
FIG. 15 is a sectional view showing a production step of a method for manufacturing a solid-state imaging device according to an embodiment of the present invention.

Next, as is indicated by a sectional view of a pixel portion shown in FIG. 14 and a sectional view of a peripheral circuit portion shown in FIG. 15, a gate-electrode-forming film 131 is formed on the gate insulating film 51 (51H, 51L) and a gate insulating film 31. The above-described gate-electrode-forming film 131 is formed through deposition of polysilicon by, for example, an LP-CVD method. The film thickness of deposition is specified to be 150 nm to 200 nm with respect to the 90-nm node, although depending on the technology node.

In general, the film thickness tends to become small on a node basis in order to avoid an increase in gate aspect ratio from the viewpoint of controllability of working.

In this regard, silicon germanium (SiGe) may be used instead of polysilicon as a measure against gate depletion. This gate depletion refers to a problem in which as the film thickness of the gate oxide film decreases, not only an influence of the physical film thickness of the gate oxide film, but also an influence of the film thickness of a depletion layer in the gate polysilicon becomes significant, the effective film thickness of the gate oxide film does not become small, and the transistor performance deteriorates.

Figure 16:
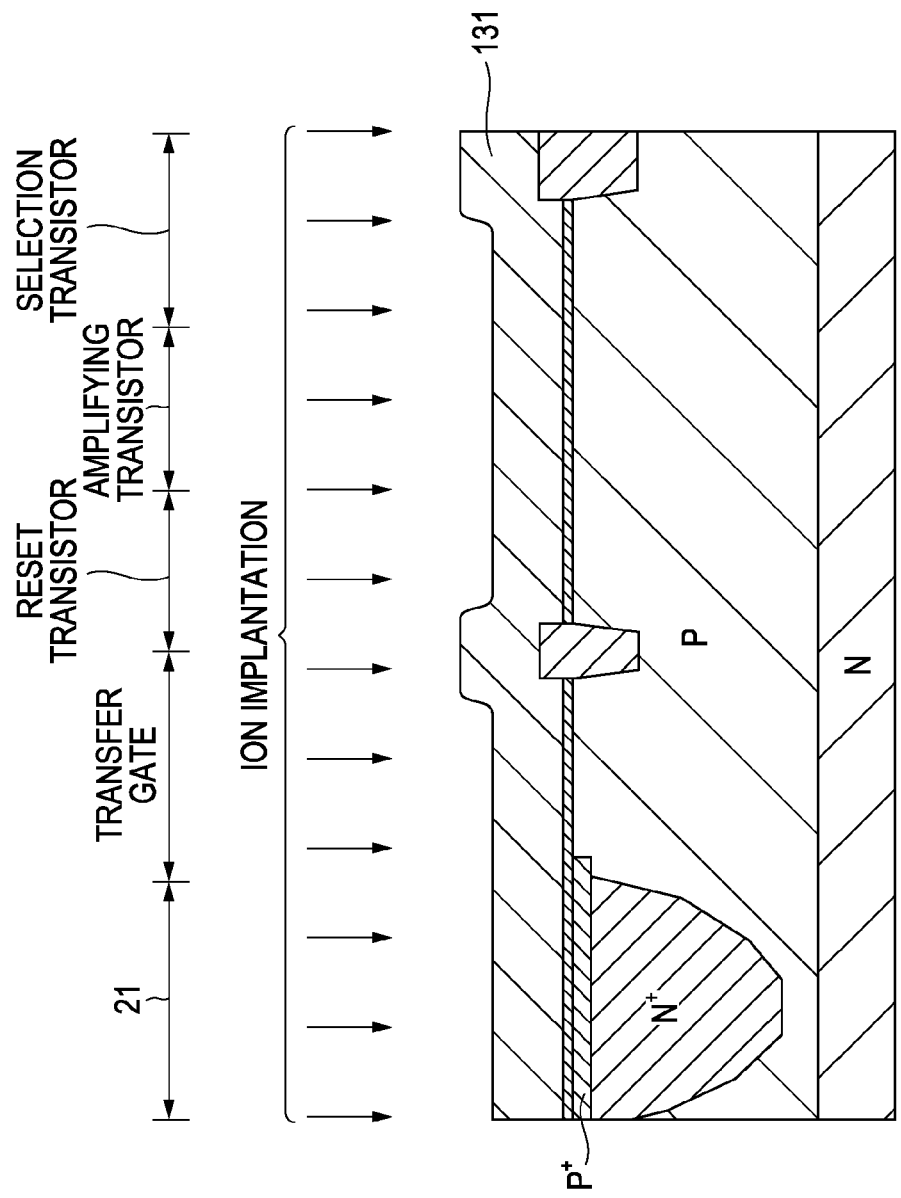
FIG. 16 is a sectional view showing a production step of a method for manufacturing a solid-state imaging device according to an embodiment of the present invention.
Figure 17:
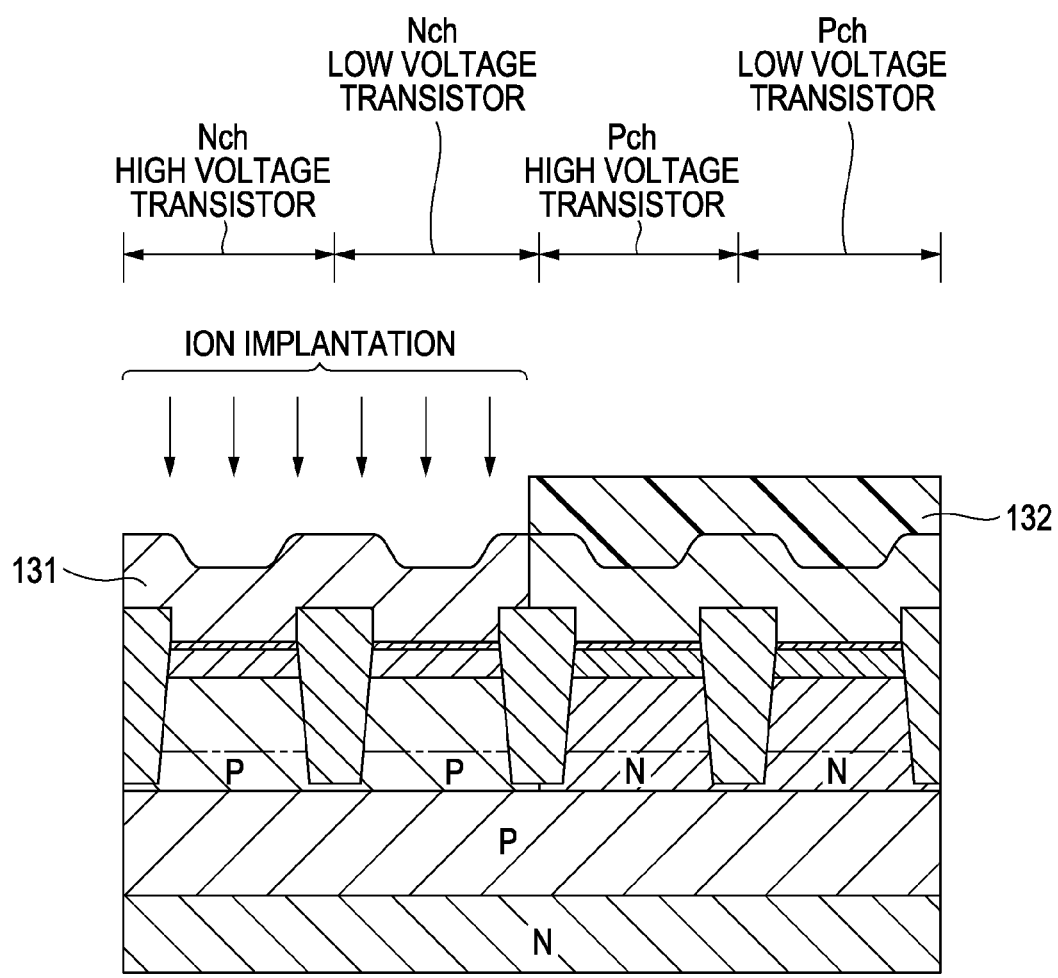
FIG. 17 is a sectional view showing a production step of a method for manufacturing a solid-state imaging device according to an embodiment of the present invention.

Next, as is indicated by a sectional view of a pixel portion shown in FIG. 16 and a sectional view of a peripheral circuit portion shown in FIG. 17, measures against gate depletion are taken. Initially, a resist mask 132 is formed on a pMOS-transistor-forming region and the above-described gate-electrode-forming film 131 in an nMOS-transistor-forming region is doped with an n-type impurity. This doping is conducted through ion implantation of, for example, phosphorus (P) or arsenic (As). The amount of ion implantation is about $1 \times 10^{15}/cm^2$ to $1 \times 10^{16}/cm^2$. Thereafter, the above-described resist mask 132 is removed.

Subsequently, although not shown in the drawing, a resist mask (not shown in the drawing) is formed on the nMOS-transistor-forming region and the above-described gate-electrode-forming film 131 in the pMOS-transistor-forming region is doped with a p-type impurity. This doping is conducted through ion implantation of, for example, boron (B), boron difluoride ($BF_2$), or indium (In). The amount of ion implantation is about $1 \times 10^{15}/cm^2$ to $1 \times 10^{16}/cm^2$. Thereafter, the above-described resist mask is removed.

Either of the above-described ion implantations is conducted on ahead.

Regarding each ion implantation described above, in order to prevent the ion-implanted impurity from penetrating just below the gate insulating film, ion implantation of nitrogen ($N_2$) may be combined.

Figure 18:
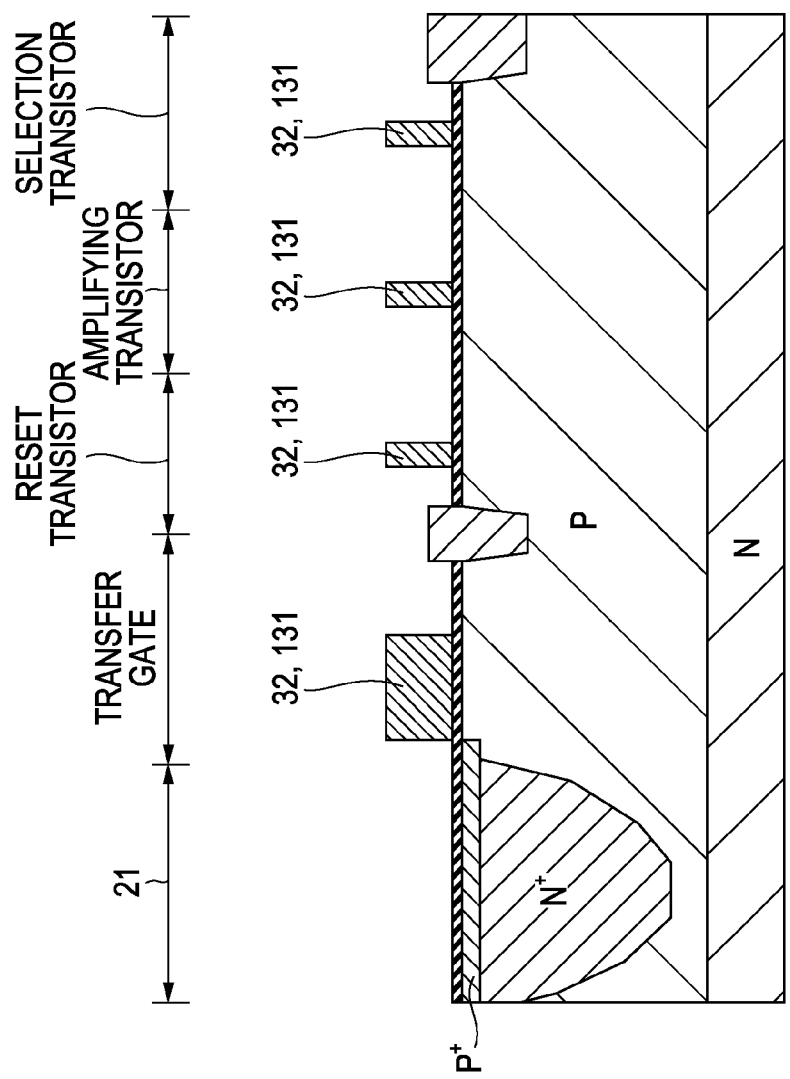
FIG. 18 is a sectional view showing a production step of a method for manufacturing a solid-state imaging device according to an embodiment of the present invention.
Figure 19:
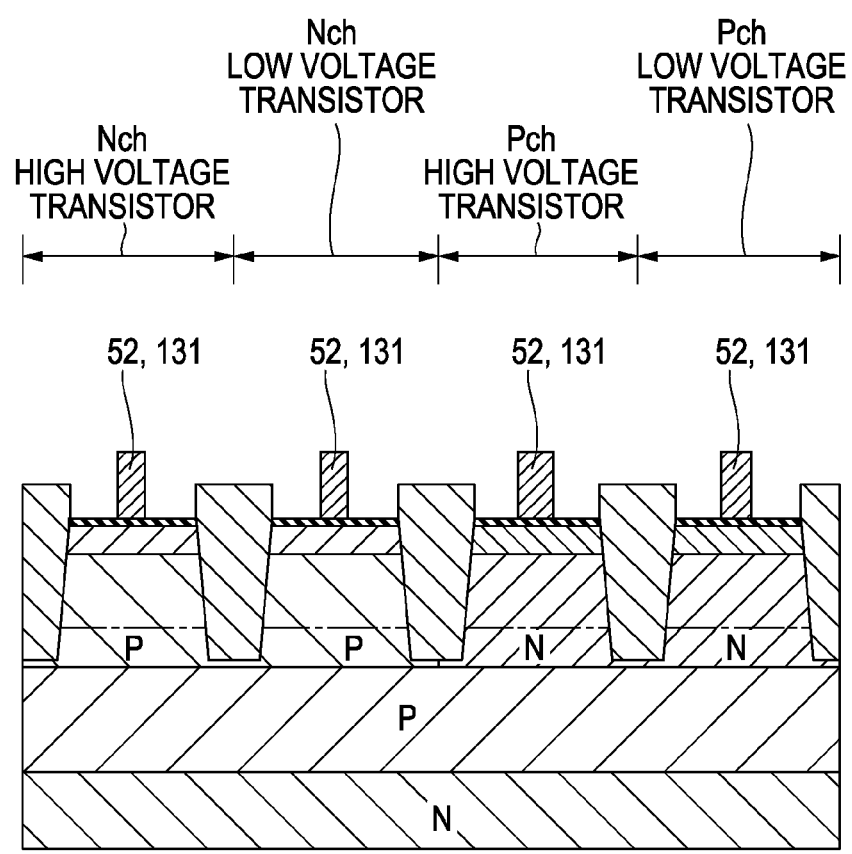
FIG. 19 is a sectional view showing a production step of a method for manufacturing a solid-state imaging device according to an embodiment of the present invention.

Next, as is indicated by a sectional view of a pixel portion shown in FIG. 18 and a sectional view of a peripheral circuit portion shown in FIG. 19, a resist mask (not shown in the drawing) for forming individual gate electrodes is formed on the above-described gate-electrode-forming film 131. The above-described gate-electrode-forming film 131 is subjected to etching through reactive ion etching by using this resist mask as an etching mask, so that gate electrodes 32 of individual MOS transistors in the pixel portion 12 and gate electrodes 52 of individual MOS transistors in the peripheral circuit portion 13 are formed.

Figure 20:
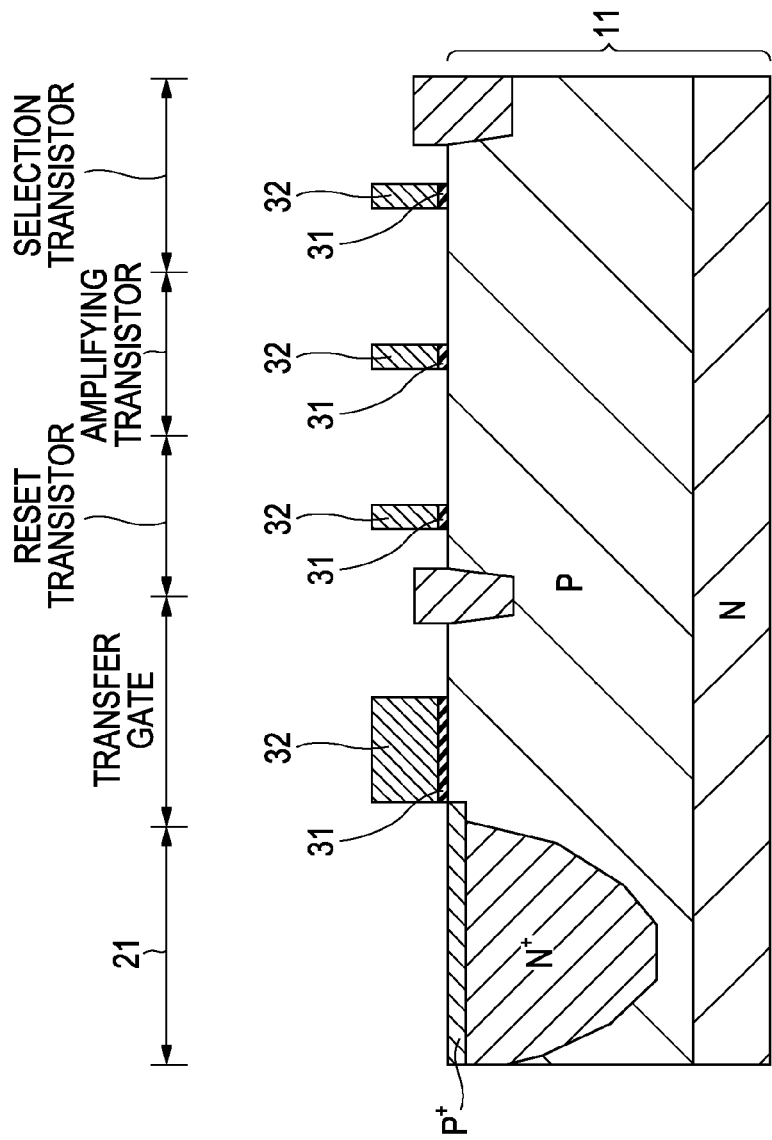
FIG. 20 is a sectional view showing a production step of a method for manufacturing a solid-state imaging device according to an embodiment of the present invention.
Figure 21:
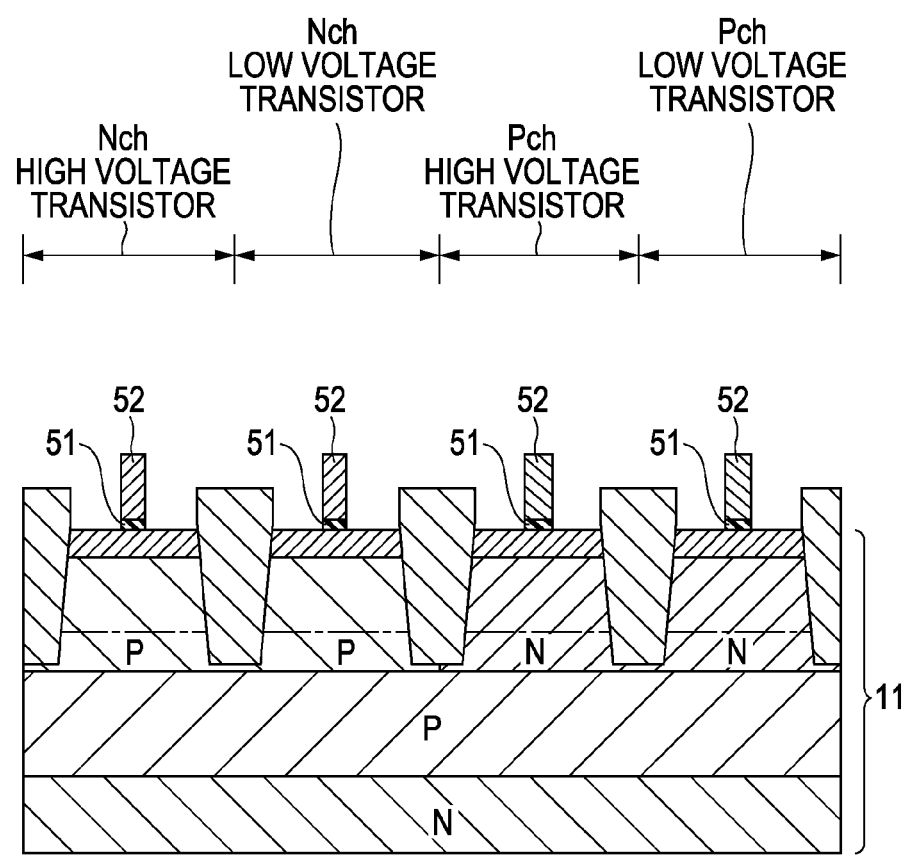
FIG. 21 is a sectional view showing a production step of a method for manufacturing a solid-state imaging device according to an embodiment of the present invention.

Subsequently, as is indicated by a sectional view of a pixel portion shown in FIG. 20 and a sectional view of a peripheral circuit portion shown in FIG. 21, the above-described gate insulating films 31 and 51 are removed from regions other than the regions which are just below the above-described gate electrodes 32 and 52 and in which the gate insulating films 31 and 51 are left. It is desirable that removal of the gate insulating films 31 and 51 is conducted through wet etching in order to prevent an etching damage to the substrate.

Figure 22:
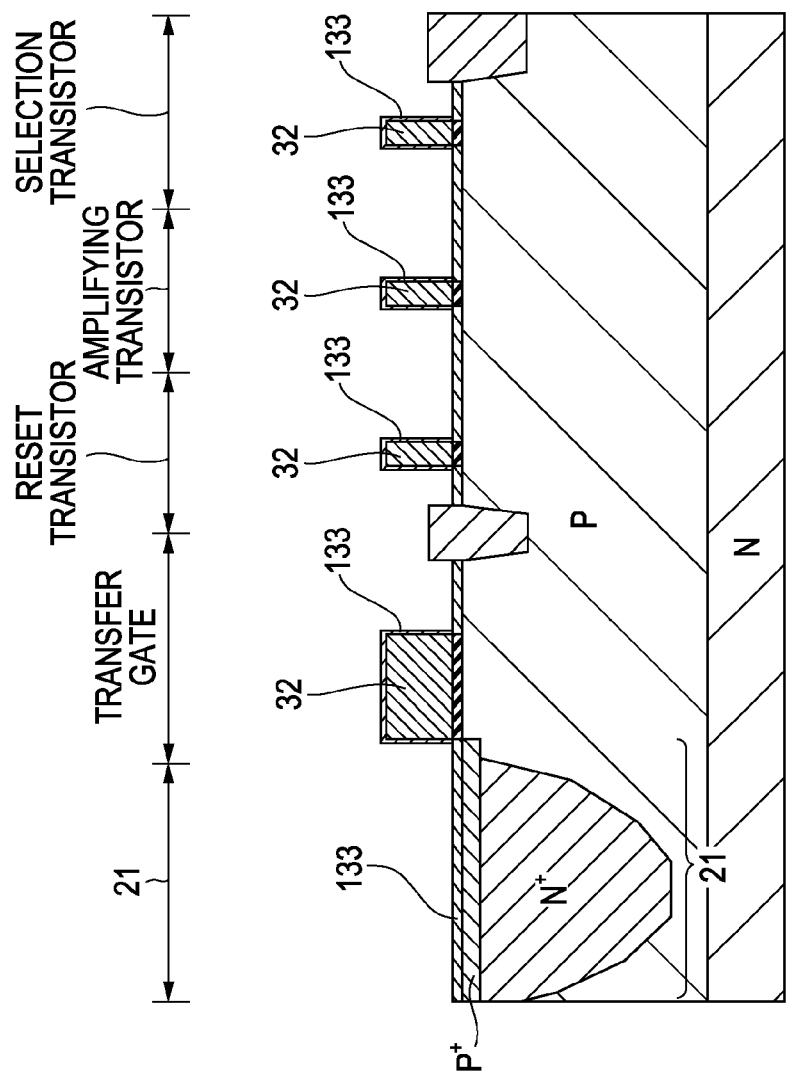
FIG. 22 is a sectional view showing a production step of a method for manufacturing a solid-state imaging device according to an embodiment of the present invention.
Figure 23:
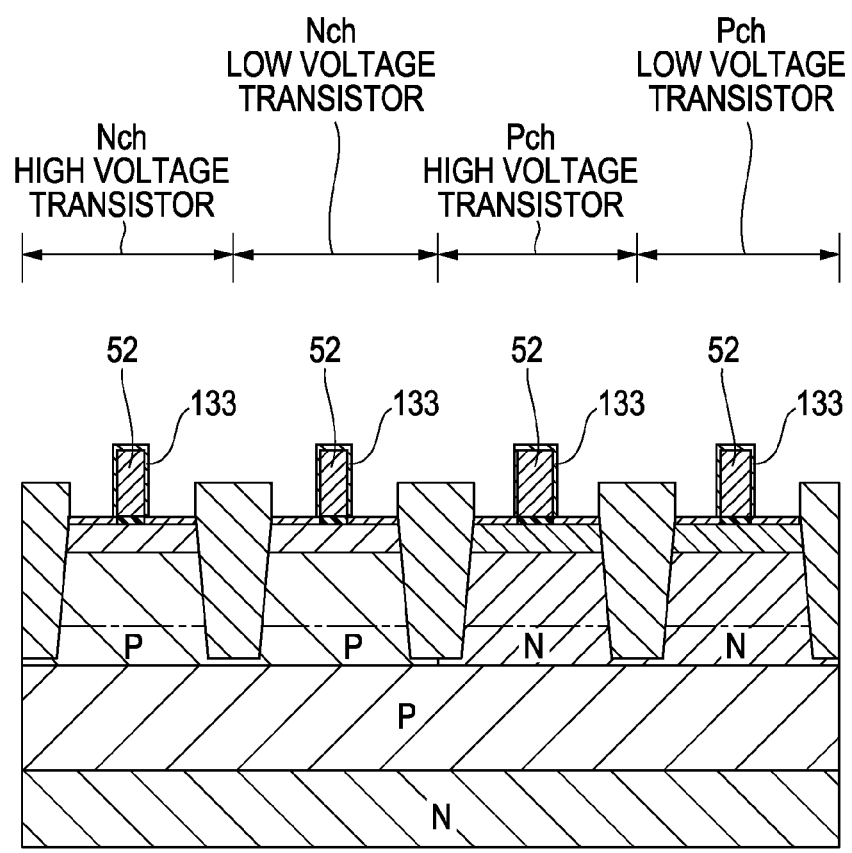
FIG. 23 is a sectional view showing a production step of a method for manufacturing a solid-state imaging device according to an embodiment of the present invention.

Next, as is indicated by a sectional view of a pixel portion shown in FIG. 22 and a sectional view of a peripheral circuit portion shown in FIG. 23, the surfaces of the above-described individual gate electrodes 32 and 52 are oxidized so as to form oxide films 133.

The film thickness of the above-described oxide film 133 is specified to be, for example, 1 nm to 10 nm. Furthermore, the above-described oxide films 133 are formed on the upper surfaces, as well as the sidewalls, of the above-described gate electrodes 32 and 52.

Moreover, the edge portions of the above-described gate electrodes 32 and 52 are rounded in the above-described oxidation step and, thereby, an effect of improving the voltage resistance of the oxide film can be exerted.

In addition, an etching damage can be reduced by conducting the above-described heat treatment.

Furthermore, in the working of the above-described gate electrode, even if the above-described gate insulating film disposed on the photoelectric conversion portion 21 is removed, the above-described oxide film 133 is formed also on the photoelectric conversion portion 21. Consequently, when a resist film is formed in the following lithography technology, direct mounting on the silicon surface is avoided. Therefore, contamination due to this resist can be prevented. Hence, this serves as a measure for preventing an occurrence of white defect with respect to the photoelectric conversion portion 21 in the pixel portion 12.

Figure 24:
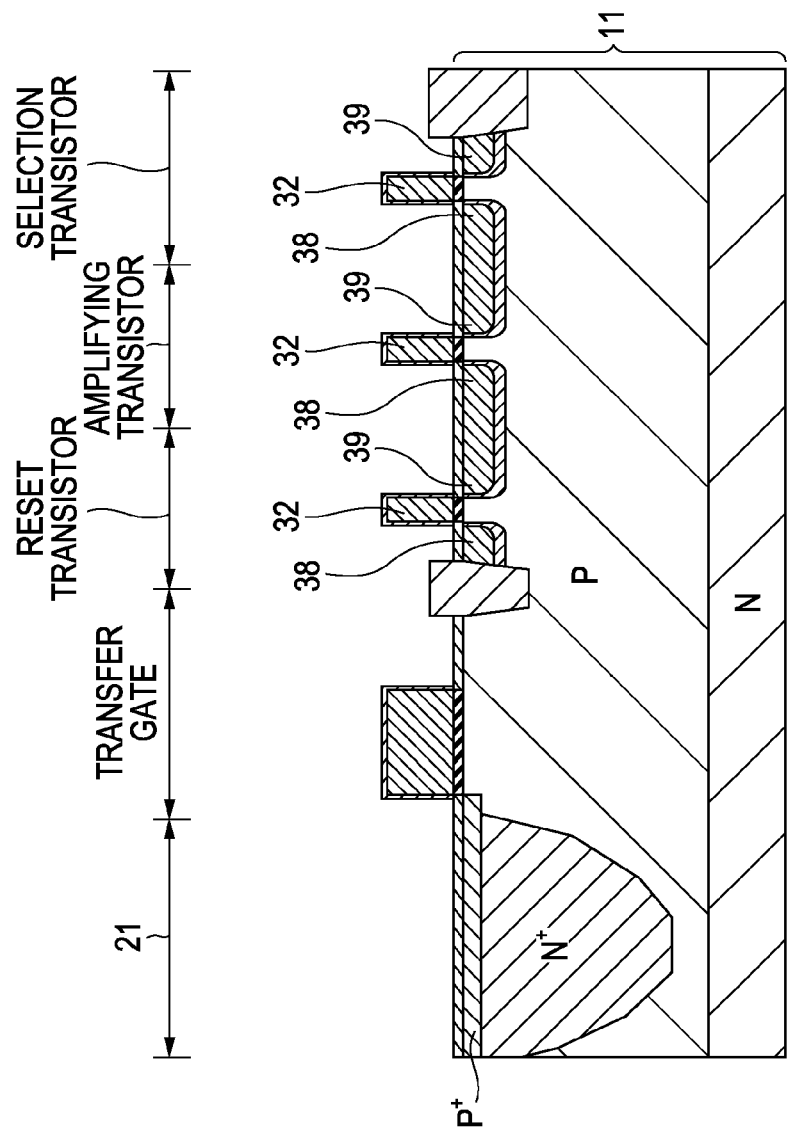
FIG. 24 is a sectional view showing a production step of a method for manufacturing a solid-state imaging device according to an embodiment of the present invention.
Figure 25:
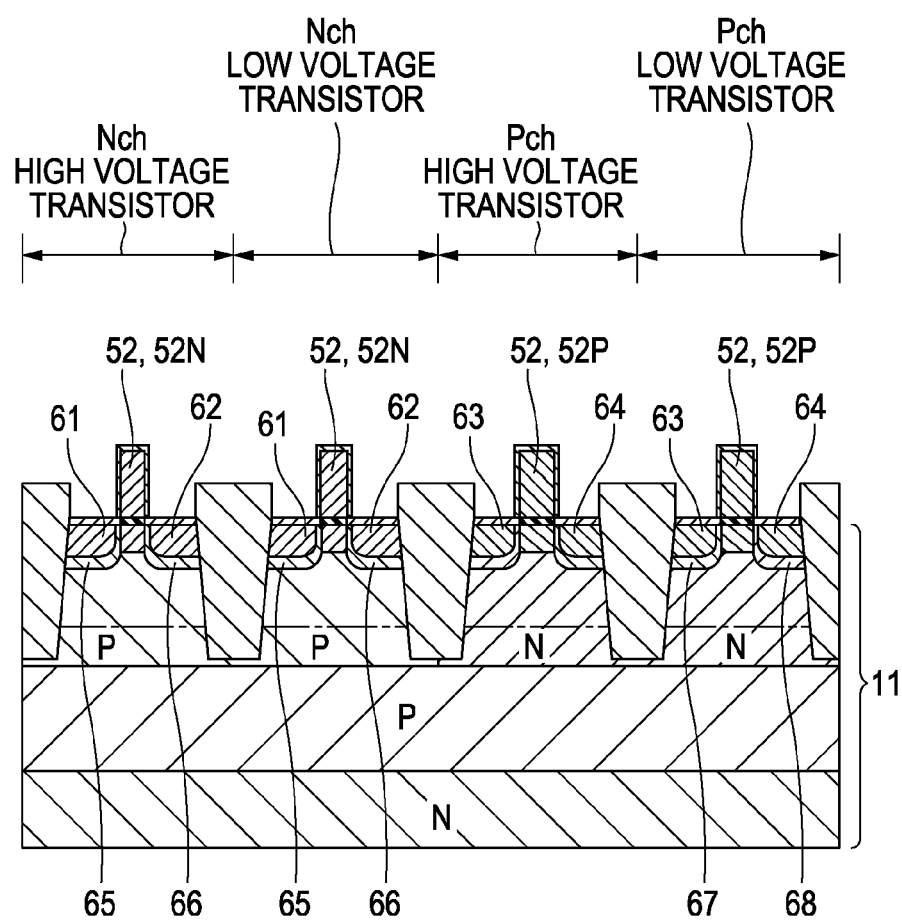
FIG. 25 is a sectional view showing a production step of a method for manufacturing a solid-state imaging device according to an embodiment of the present invention.

Next, as is indicated by a sectional view of a pixel portion shown in FIG. 24 and a sectional view of a peripheral circuit portion shown in FIG. 25, LDDs 38 and 39 and the like of individual MOS transistors in the pixel portion 12 are formed and, in addition, LDDs 61, 62, 63, and 64 and the like of individual MOS transistors in the peripheral circuit portion 13 are formed. At this time, the LDD 39 of a reset transistor and the LDD 38 of an amplifying transistor are formed as a common diffusion layer, and the LDD 39 of the amplifying transistor and the LDD 38 of a selection transistor are formed as a common diffusion layer.

Initially, regarding NMOS transistors formed in the peripheral circuit portion 13, pocket diffusion layers 65 and 66 are formed in the semiconductor substrate 11 on both sides of the individual gate electrodes 52 (52N). These pocket diffusion layers 65 and 66 are formed through ion implantation and, for example, boron difluoride ($BF_2$), boron (B), or indium (In) is used as an ion implantation species. The amount of dose is set at, for example, $1\times10^{12}/cm^2$ to $1\times10^{14}/cm^2$.

Furthermore, LDDs 61 and 62 are formed in the semiconductor substrate 11 on both sides of the individual gate electrodes 52 (52N). The LDDs 61 and 62 are formed through ion implantation and, for example, arsenic (As) or phosphorus (P) is used as an ion implantation species. The amount of dose is set at, for example, $1\times10^{13}/cm^2$ to $1\times10^{15}/cm^2$.

Regarding MOS transistors formed in the above-described pixel portion 12, LDDs 38 and 39 are formed in the semiconductor substrate 11 on both sides of the individual gate electrodes 32. The LDDs 38 and 39 are formed through ion implantation and, for example, arsenic (As) or phosphorus (P) is used as an ion implantation species. The amount of dose is set at, for example, $1\times10^{13}/cm^2$ to $1\times10^{15}/cm^2$. In addition, pocket diffusing layers may be formed.

Regarding the MOS transistors formed in the above-described pixel portion 12, no LDD may be formed from the viewpoint of reduction in steps. Alternatively, the ion implantation may be combined with the LDD ion implantation of the MOS transistors formed in the peripheral circuit portion 13.

Regarding PMOS transistor-forming-regions in the peripheral circuit portion 13, pocket diffusion layers 67 and 68 are formed in the semiconductor substrate 11 on both sides of the individual gate electrodes 52 (52P). These pocket diffusion layers 67 and 68 are formed through ion implantation and, for example, arsenic (As) or phosphorus (P) is used as an ion implantation species. The amount of dose is set at, for example, $1\times10^{12}/cm^2$ to $1\times10^{14}/cm^2$.

Furthermore, LDDs 63 and 64 are formed in the semiconductor substrate 11 on both sides of the individual gate electrodes 52 (52P). The LDDs 63 and 64 are formed through ion implantation and, for example, boron difluoride ($BF_2$), boron (B), or indium (In) is used as an ion implantation species. The amount of dose is set at, for example, $1\times10^{12}/cm^2$ to $1\times10^{15}/cm^2$.

As for a technology to suppress channeling in implantation, preamorphization may be conducted by, for example, conducting ion implantation of germanium (Ge) before the pocket ion implantation of the NMOS transistors and PMOS transistors in the peripheral circuit portion. Furthermore, after the LDD is formed, a rapid thermal annealing (RTA) treatment at about 800° C. to 900° C. may be added in order to allow implantation defects, which cause transient enhanced diffusion (TED) and the like, to become small.

Figure 26:
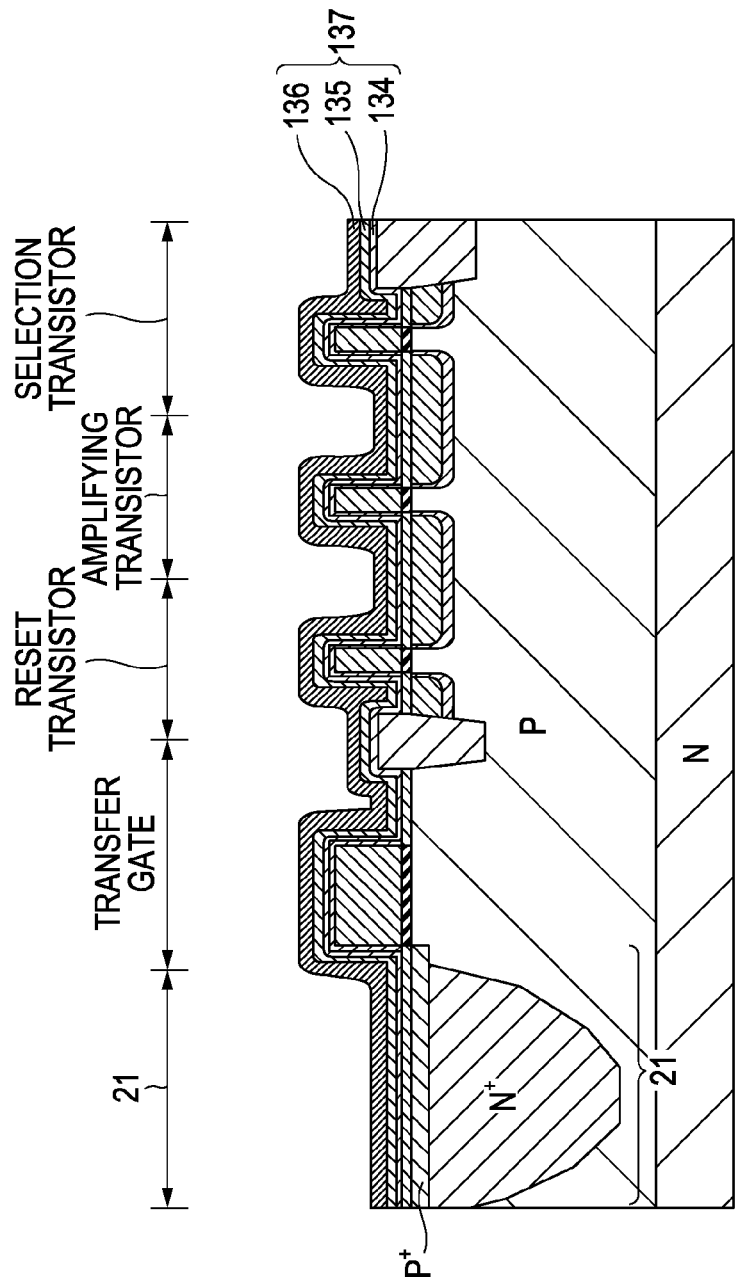
FIG. 26 is a sectional view showing a production step of a method for manufacturing a solid-state imaging device according to an embodiment of the present invention.
Figure 27:
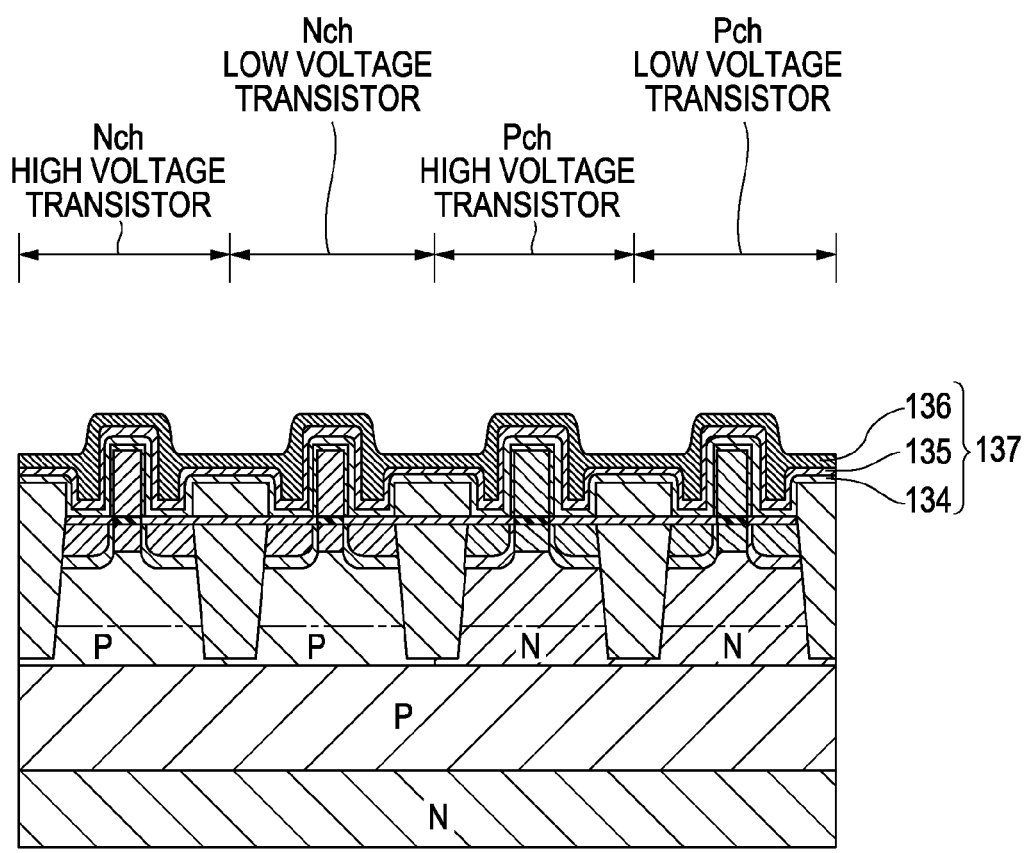
FIG. 27 is a sectional view showing a production step of a method for manufacturing a solid-state imaging device according to an embodiment of the present invention.

Next, as is indicated by a sectional view of a pixel portion shown in FIG. 26 and a sectional view of a peripheral circuit portion shown in FIG. 27, a silicon oxide ($SiO_2$) film 134 is formed all over the pixel portion 12 and the peripheral circuit portion 13. This silicon oxide film 134 is formed from an deposition film, e.g., a non-doped silicate glass (NSG), low pressure tetra ethyl ortho silicate (LP-TEOS), or high temperature oxide (HTO) film. The above-described silicon oxide film 134 is formed having a film thickness of, for example, 5 nm to 20 nm.

Subsequently, a silicon nitride film 135 is formed on the above-described silicon oxide film 134. As for this silicon nitride film 135, for example, a silicon nitride film formed through LP-CVD is used. The film thickness thereof is specified to be, for example, 10 nm to 100 nm.

The above-described silicon nitride film 135 may be an ALD silicon nitride film formed by an atomic layer deposition method in which film can be formed at low temperatures.

Regarding the above-described silicon oxide film 134 just below the above-described silicon nitride film 135, as the film thickness thereof is reduced on the photoelectric conversion portion 21 in the pixel portion 12, reflection of light is prevented, so that the sensitivity of the photoelectric conversion portion 21 is improved.

Then, if necessary, a third layer, i.e. silicon oxide ($SiO_2$) film 136, is deposited on the above-described silicon nitride film 135. This silicon oxide film 136 is formed from a deposition film of NSG, LP-TEOS, HTO, or the like. This silicon oxide film 136 is formed having a film thickness of, for example, 10 nm to 100 nm.

Therefore, a sidewall-forming film 137 becomes a three-layer structure film composed of silicon oxide film 136/silicon nitride film 135/silicon oxide film 134. In this regard, the sidewall-forming film 137 may be a two-layer structure film composed of silicon nitride film/silicon oxide film. The sidewall-forming film 137 composed of a three-layer structure film will be described below.

Figure 28:
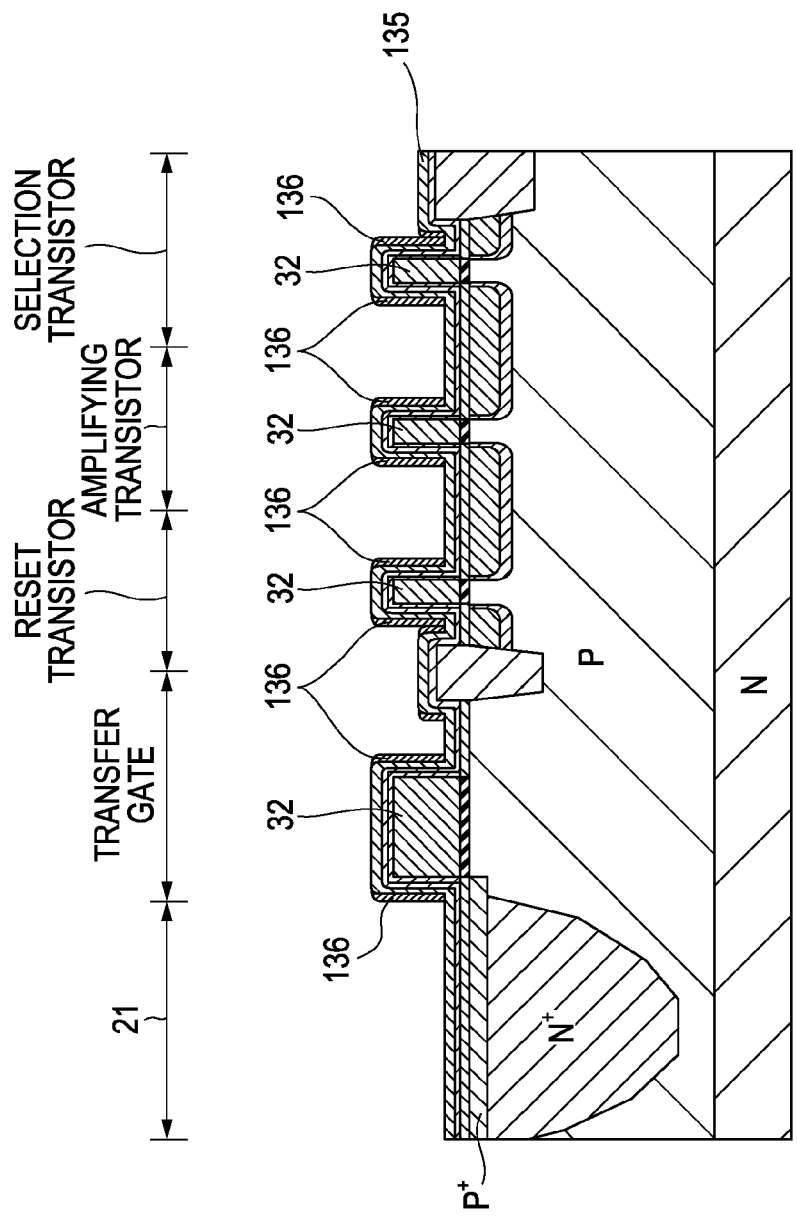
FIG. 28 is a sectional view showing a production step of a method for manufacturing a solid-state imaging device according to an embodiment of the present invention.
Figure 29:
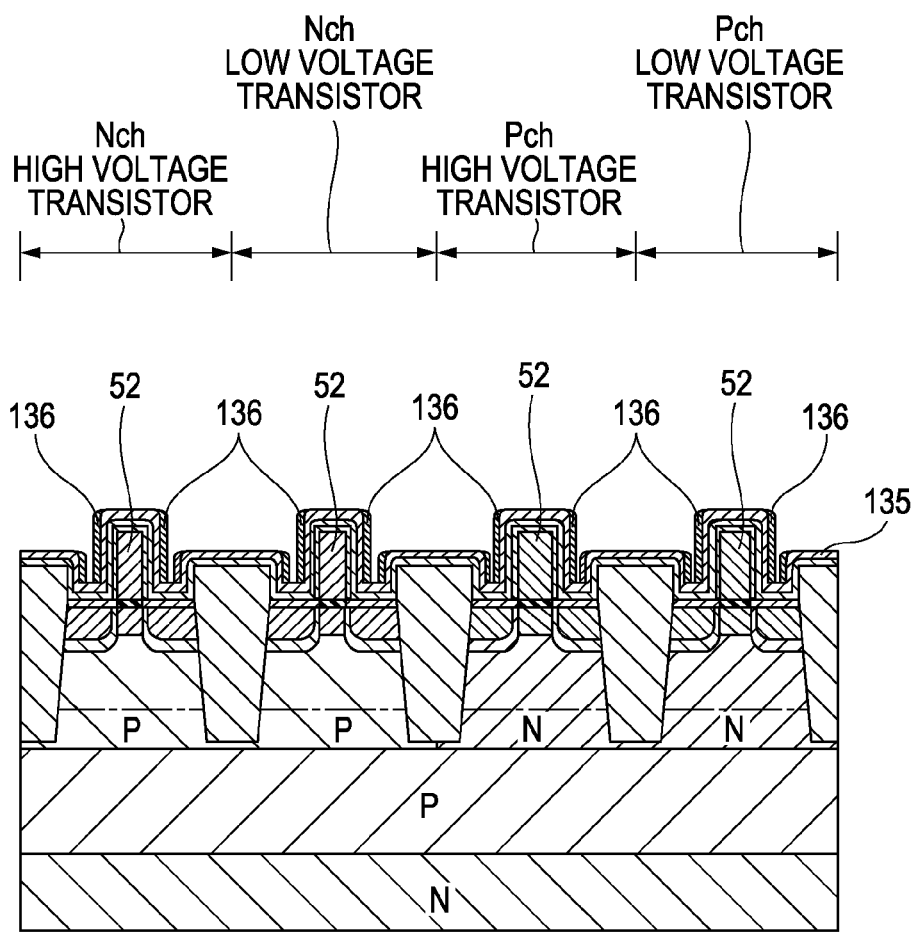
FIG. 29 is a sectional view showing a production step of a method for manufacturing a solid-state imaging device according to an embodiment of the present invention.

Next, as is indicated by a sectional view of a pixel portion shown in FIG. 28 and a sectional view of a peripheral circuit portion shown in FIG. 29, the above-described silicon oxide film 136 disposed as the uppermost layer is subjected to etch back so as to remain on the side portion sides of the individual gate electrodes 32 and 52 and the like. The above-described etch back is conducted through, for example, reactive ion etching (RIE). Regarding this etch back, etching is stopped by the above-described silicon nitride film 135. Since the etching is stopped by the above-described silicon nitride film 135, as described above, an etching damage to the photoelectric conversion portion 21 in the pixel portion 12 can be reduced and, thereby, white defects can be reduced.

Figure 30:
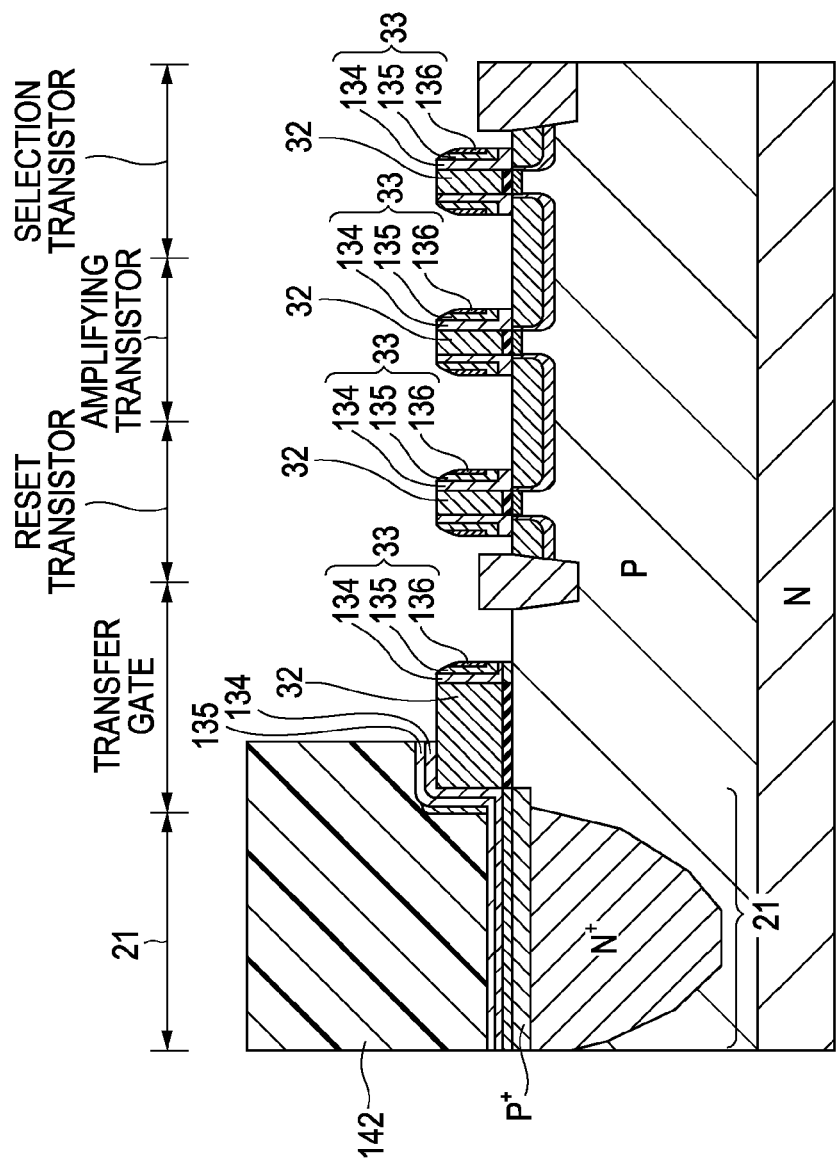
FIG. 30 is a sectional view showing a production step of a method for manufacturing a solid-state imaging device according to an embodiment of the present invention.
Figure 31:
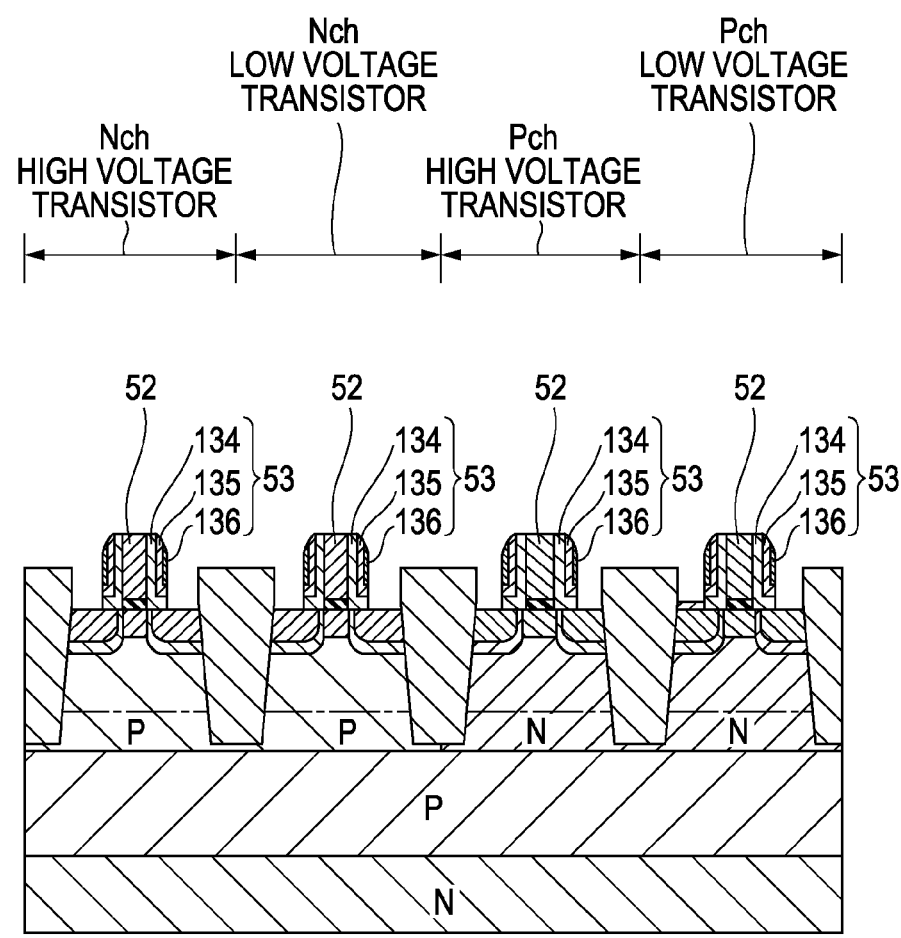
FIG. 31 is a sectional view showing a production step of a method for manufacturing a solid-state imaging device according to an embodiment of the present invention.

Subsequently, as is indicated by a sectional view of a pixel portion shown in FIG. 30 and a sectional view of a peripheral circuit portion shown in FIG. 31, a resist mask 142 is formed all over the photoelectric conversion portion 21 in the pixel portion 12 and on a part of the transfer gate TRG.

Thereafter, the above-described silicon nitride film 135 and the above-described silicon oxide film 134 are subjected to etch back, so that the first sidewall 33 and the second sidewall 53, each composed of the silicon oxide film 134, the silicon nitride film 135, and the silicon oxide film 136, are formed on the sidewall portions of the individual gate electrodes 32 and 52. At this time, the silicon nitride film 135 and the silicon oxide film 134 on the photoelectric conversion portion 21 are not etched because of being covered with the resist mask 142.

Figure 32:
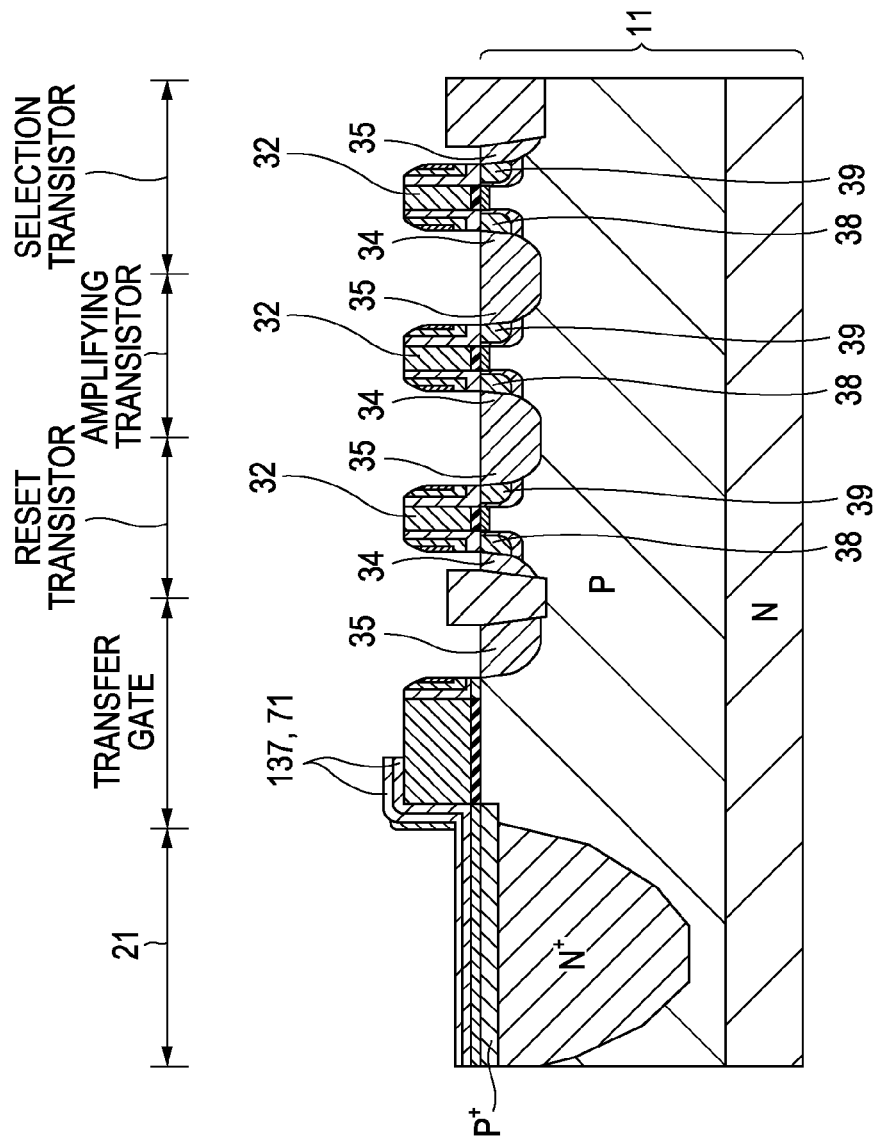
FIG. 32 is a sectional view showing a production step of a method for manufacturing a solid-state imaging device according to an embodiment of the present invention.
Figure 33:
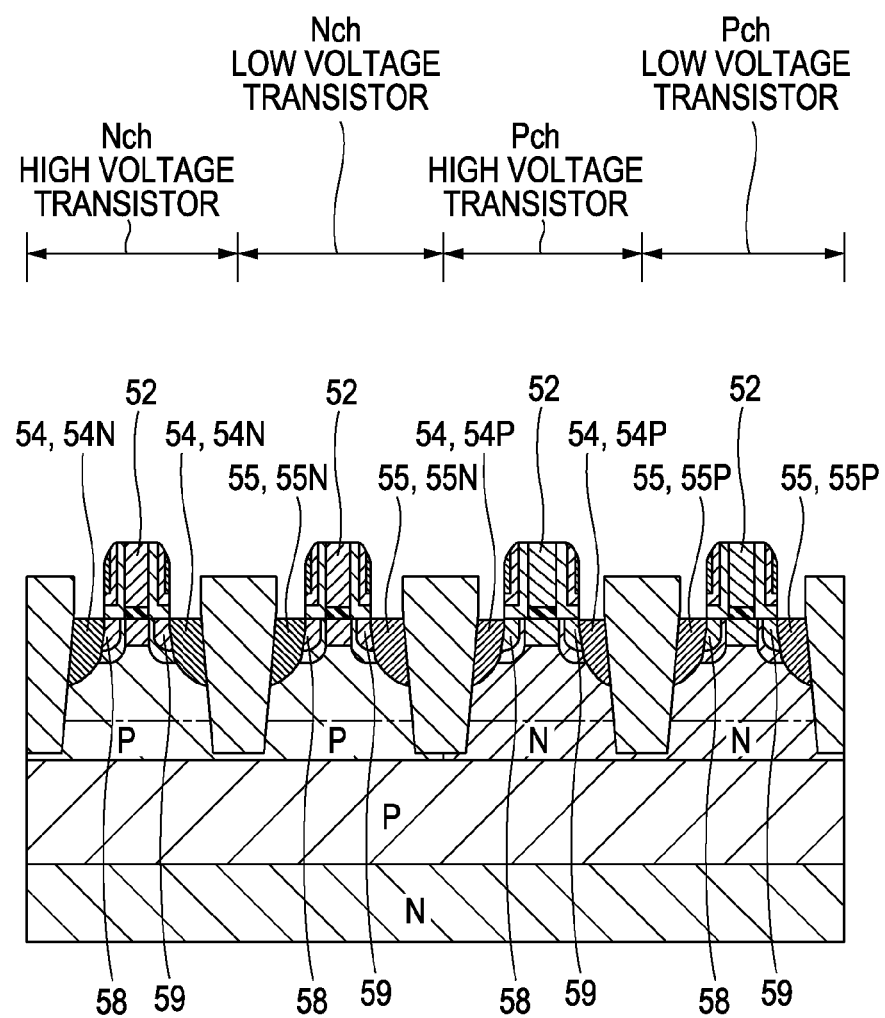
FIG. 33 is a sectional view showing a production step of a method for manufacturing a solid-state imaging device according to an embodiment of the present invention.

Then, as is indicated by a sectional view of a pixel portion shown in FIG. 32 and a sectional view of a peripheral circuit portion shown in FIG. 33, a resist mask (not shown in the drawing) with openings above the NMOS-transistor-forming regions in the peripheral circuit portion 13 is formed, and by using this, deep source-drain regions 54 (54N) and 55 (55N) are formed in the NMOS-transistor-forming regions in the peripheral circuit portion 13 through ion implantation. That is, the above-described source-drain regions 54N and 55N are formed on both sides of the individual gate electrodes 52 in the semiconductor substrate 11 with the above-described LDDs 58 and 59 and the like therebetween. The above-described source-drain regions 54N and 55N are formed through ion implantation and, for example, arsenic (As) or phosphorus (P) is used as an ion implantation species. The amount of dose is set at, for example, $1 \times 10^{15}/cm^2$ to $1 \times 10^{16}/cm^2$. Thereafter, the above-described resist mask is removed.

Next, a resist mask (not shown in the drawing) with openings above the NMOS-transistor-forming regions in the pixel portion 12 is formed, and by using this, deep source-drain regions 34 and 35 are formed in the NMOS-transistor-forming regions in the pixel portion 12 through ion implantation. That is, the above-described source-drain regions 34 and 35 are formed on both sides of the individual gate electrodes 32 in the semiconductor substrate 11 with the above-described LDDs 38 and 39 and the like therebetween. The above-described source-drain regions 34 and 35 are formed through ion implantation and, for example, arsenic (As) or phosphorus (P) is used as an ion implantation species. The amount of dose is set at, for example, $1 \times 10^{15}/cm^2$ to $1 \times 10^{16}/cm^2$. Thereafter, the above-described resist mask is removed.

This ion implantation may be combined with the ion implantation for forming the above-described source-drain regions 54N and 55N of the NMOS transistors in the above-described peripheral circuit portion.

In the above-described ion implantation, the source-drain region 34 of the above-described amplifying transistor is formed as a diffusion layer common to the source-drain region 35 of the reset transistor, and the source-drain region 35 of the above-described amplifying transistor is formed as a diffusion layer common to the source-drain region 34 of the selection transistor.

In the formation of the source-drain regions described in International Patent Publication WO 2003/096421 in the related art, the ion implantation through three layers and the ion implantation in the state in which no film is disposed are conducted and, therefore, it is difficult to combine them.

Subsequently, a resist mask (not shown in the drawing) with openings above the PMOS-transistor-forming regions in the peripheral circuit portion 13 is formed, and by using this, deep source-drain regions 54 (54P) and 55 (55P) are formed in the PMOS-transistor-forming regions in the peripheral circuit portion 13 through ion implantation. That is, the above-described source-drain regions 54P and 55P are formed on both sides of the individual gate electrodes 52 in the semiconductor substrate 11 with LDDs 58 and 59 and the like therebetween. The above-described source-drain regions 54P and 55P are formed through ion implantation and, for example, boron (B) or boron difluoride ($BF_2$) is used as an ion implantation species. The amount of dose is set at, for example, $1 \times 10^{15}/cm^2$ to $1 \times 10^{16}/cm^2$. Thereafter, the above-described resist mask is removed.

Then, activation annealing of individual source-drain regions is conducted. This activation annealing is conducted at, for example, about 800° C. to 1,100° C. As for the apparatus to conduct this activation annealing, for example, a rapid thermal annealing (RTA) apparatus, a spike-RTA apparatus, and the like may be used.

Before activation annealing of the above-described source-drain regions, a sidewall-forming film 137 covering the photoelectric conversion portion 21 is cut from the sidewall 33 formed from the sidewall-forming film 137 on the gate electrode 32 of the MOS transistor in the pixel portion 12. Consequently, deterioration due to a stress resulting from stress memorization technique (SMT) in the related art does not occur.

Therefore, white defects, random noises, and the like can be improved.

Furthermore, the photoelectric conversion portion 21 is covered with the sidewall-forming film 137, and the resist mask in the ion implantation for forming the source-drain regions is formed on the photoelectric conversion portion 21 with the sidewall-forming film 137 therebetween. Therefore, the resist mask is not directly disposed on the surface of the photoelectric conversion portion 21. Consequently, the photoelectric conversion portion 21 is not contaminated by contaminants in the resist, so that increases in white defect, dark current, and the like can be suppressed.

Moreover, in the ion implantation for forming the source-drain regions, the ion implantation is conducted without passing through a film, so that the depth can be set while a high concentration is ensured at the surface. Therefore, an increase in series resistance in the source-drain regions can be suppressed.

In addition, the above-described sidewall-forming film 137 covering the above-described photoelectric conversion portion 21 is used as a first silicide block film 71 in the following step.

Figure 34:
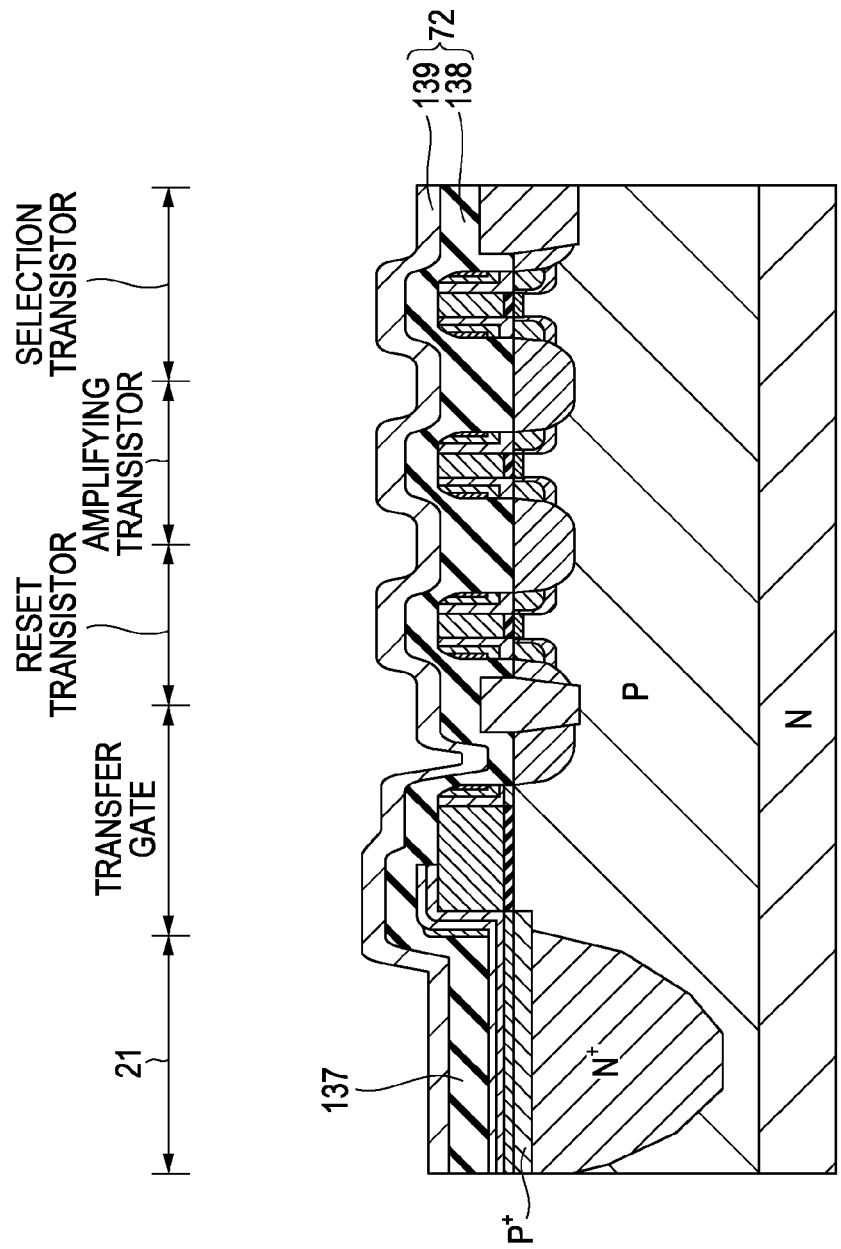
FIG. 34 is a sectional view showing a production step of a method for manufacturing a solid-state imaging device according to an embodiment of the present invention.

Next, as is indicated by a sectional view of a pixel portion shown in FIG. 34 and a sectional view of a peripheral circuit portion shown in FIG. 35, a second silicide block film 72 is formed all over the pixel portion 12 and the peripheral circuit portion 13. The second silicide block film 72 is formed from a laminate film composed of a silicon oxide ($SiO_2$) film 138 and a silicon nitride ($Si_3N_4$) film 139. For example, the above-described silicon oxide film 138 is formed having a film thickness of, for example, 5 nm to 40 nm, the above-described silicon nitride film 139 is formed having a film thickness of, for example, 5 nm to 60 nm.

As for the above-described silicon oxide film 138, NSG, LP-TEOS, an HTO film, and the like are used. As for the above-described silicon nitride film 139, ALD-SiN, a plasma nitriding film, LP-SiN, and the like are used. If the film formation temperatures of these two layers of films are high, inactivation of boron occurs in the gate electrode of the PMOSFET, and the current drivability of the PMOSFET deteriorates because of gate depletion. Consequently, it is desirable that the film formation temperature is low relative to the film formation temperature of the sidewall-forming film 137. It is desirable that the film formation temperature is, for example, 700° C. or lower.

Figure 36:
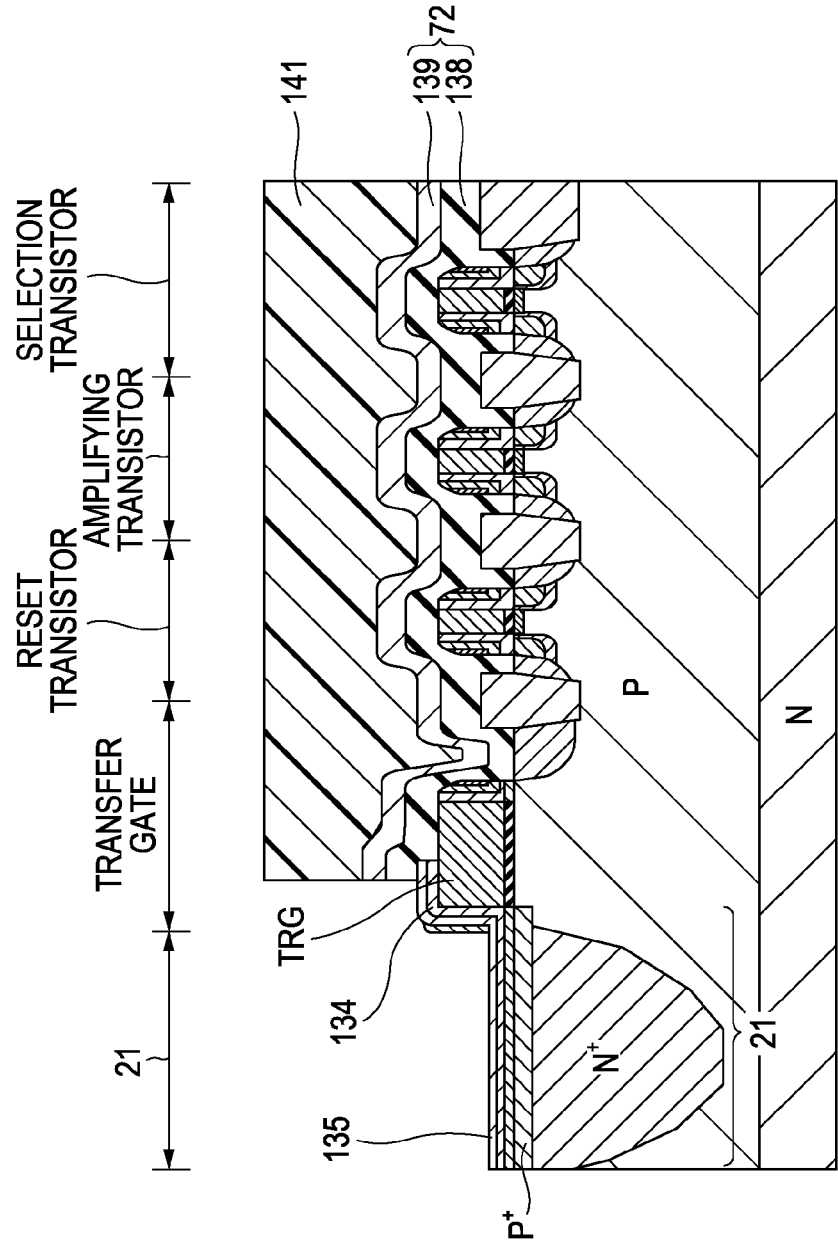
FIG. 36 is a sectional view showing a production step of a method for manufacturing a solid-state imaging device according to an embodiment of the present invention.
Figure 37:
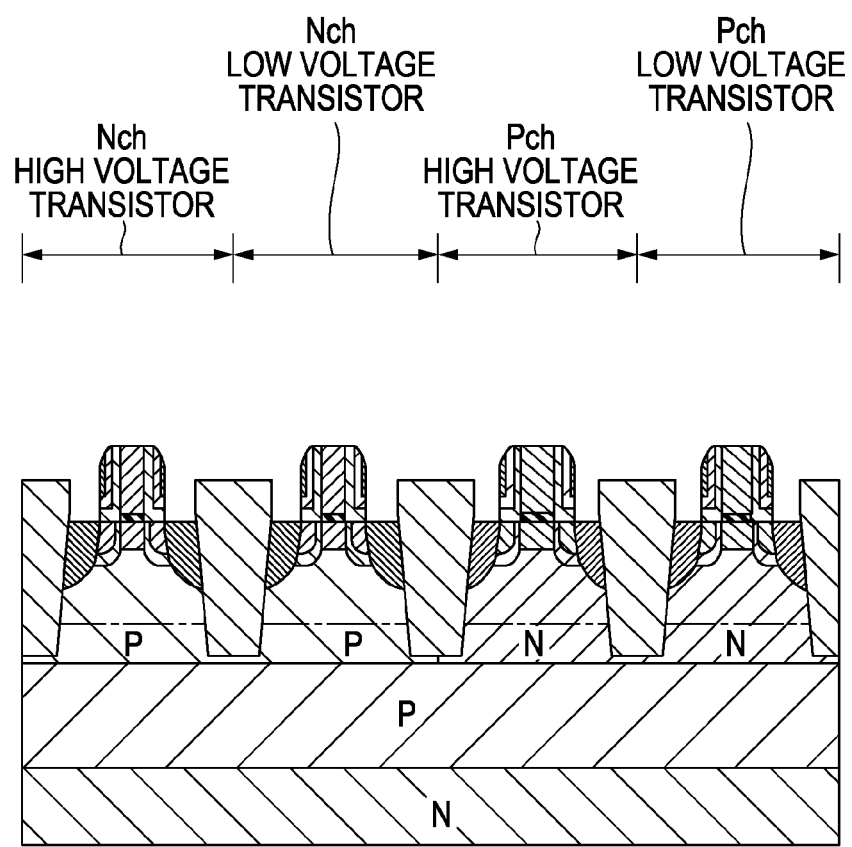
FIG. 37 is a sectional view showing a production step of a method for manufacturing a solid-state imaging device according to an embodiment of the present invention.

Subsequently, as is indicated by a sectional view of a pixel portion shown in FIG. 36 and a sectional view of a peripheral circuit portion shown in FIG. 37, a resist mask 141 is formed to almost cover the MOS-transistor-forming regions in the pixel portion 12. This resist mask 141 is used as an etching mask, and the above-described second silicide block film 72 on the photoelectric conversion portion 21 (including a part of the second silicide block film 72 on the transfer gate TRG) in the above-described pixel portion 12 and on the peripheral circuit portion 13 through etching.

As a result, the silicon nitride film 135 and the silicon oxide film 134 are disposed on the photoelectric conversion portion 21 in that order from above, and a ripple in dispersion of light can be prevented. On the other hand, in the case where the above-described etching is not conducted, the silicon nitride film 139, the silicon oxide film 138, the silicon nitride film 135, and the silicon oxide film 134 are disposed on the photoelectric conversion portion 21 in that order from above, the incident light is multi-reflected and the ripple property in dispersion of light deteriorates. Since the ripple property deteriorates, chip-to-chip variations in dispersion of light increase. Therefore, in the present embodiment, the second silicide block film 72 on the photoelectric conversion portion 21 is peeled off intentionally.

Figure 38:
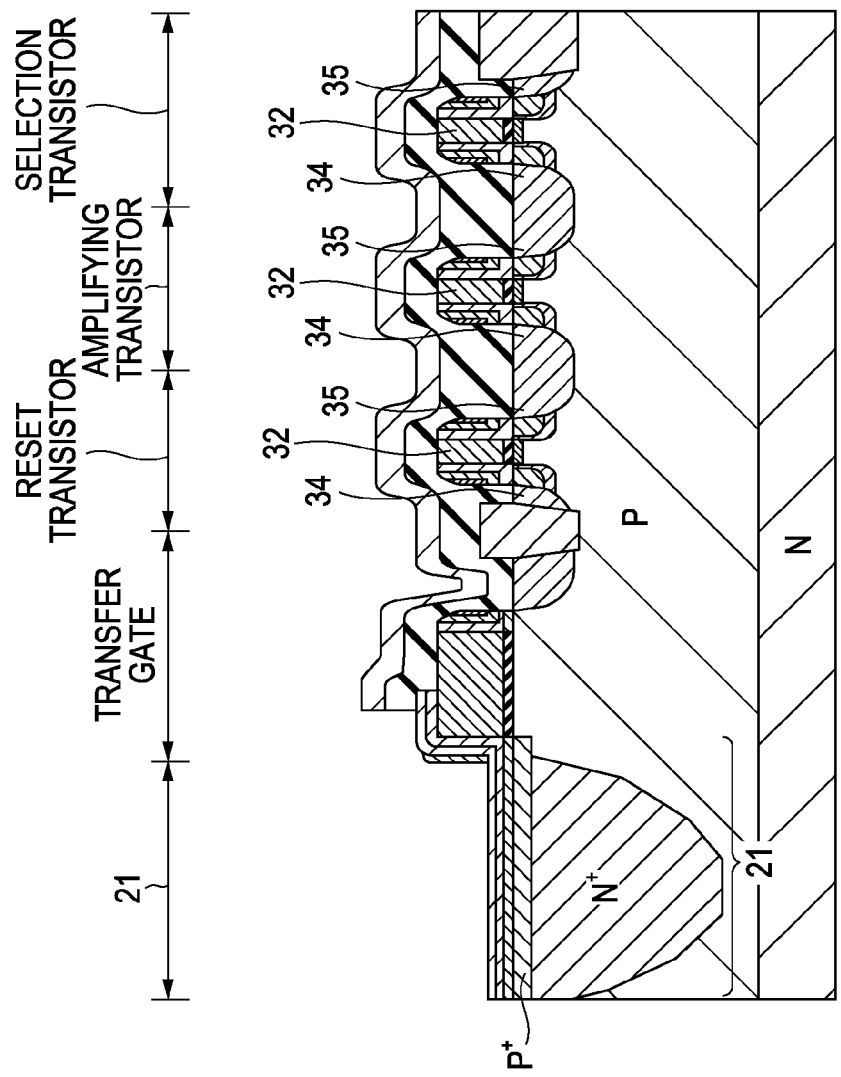
FIG. 38 is a sectional view showing a production step of a method for manufacturing a solid-state imaging device according to an embodiment of the present invention.
Figure 39:
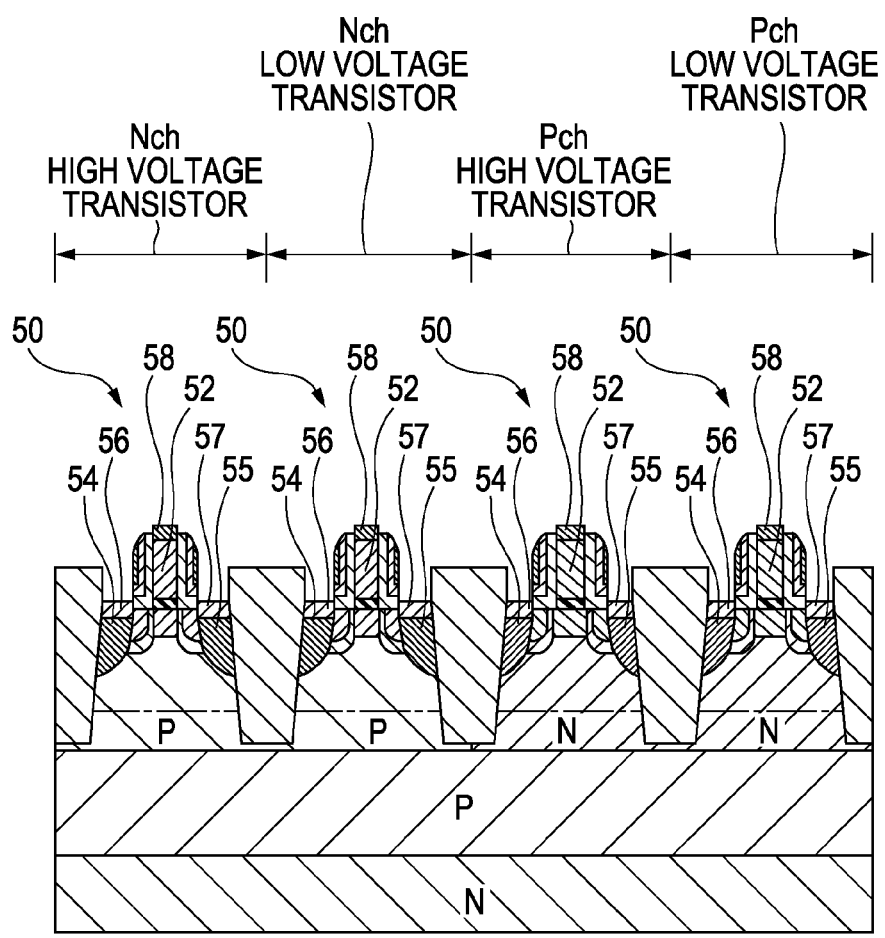
FIG. 39 is a sectional view showing a production step of a method for manufacturing a solid-state imaging device according to an embodiment of the present invention.

Next, as is indicated by a sectional view of a pixel portion shown in FIG. 38 and a sectional view of a peripheral circuit portion shown in FIG. 39, silicide layers 56, 57, and 58 are formed on the source-drain regions 54 and 55 and the gate electrodes 52 of the individual MOS transistors 50 in the peripheral circuit portion 13.

As for the above-described silicide layers 56, 57, and 58, cobalt silicide ($CoSi_2$), nickel silicide (NiSi), titanium silicide ($TiSi_2$), platinum silicide (PtSi), tungsten silicide ($WSi_2$), and the like are used.

As for examples of formation of the silicide layers 56, 57, and 58, an example in which nickel silicide is formed will be described below.

Initially, a nickel (Ni) film is formed all over the surface. This nickel film is formed having a thickness of, for example, 10 nm by using a sputtering apparatus, for example. Subsequently, an annealing treatment is conducted at about 300° C. to 400° C., so that the nickel film and the substrate are allowed to react with silicon and, thereby, a nickel silicide layer is formed. Thereafter, unreacted nickel is removed through wet etching. The silicide layers 56, 57, and 58 are formed by this wet etching only on a silicon or polysilicon surface other than the insulating film through self-align.

Then, an annealing treatment is conducted again at about 500° C. to 600° C. so as to stabilize the nickel silicide layer.

In the above-described silicidation step, no silicide layer is formed on the source-drain regions 34 and 35 and the gate electrodes 32 of the MOS transistors in the pixel portion 12.

This is for the purpose of avoiding increases in white defect and dark current due to diffusion of the metal of silicide to the top of the photoelectric conversion portion 21.

Consequently, if the impurity concentrations on the surfaces of the source-drain regions 34 and 35 of the MOS transistors in the pixel portion 12 are not high, the contact resistance increases significantly. In the present example, the impurity concentrations on the surfaces of the source-drain regions 34 and 35 can be increased and, therefore, there is an advantage that an increase in contact resistance can be relatively suppressed.

Figure 40:
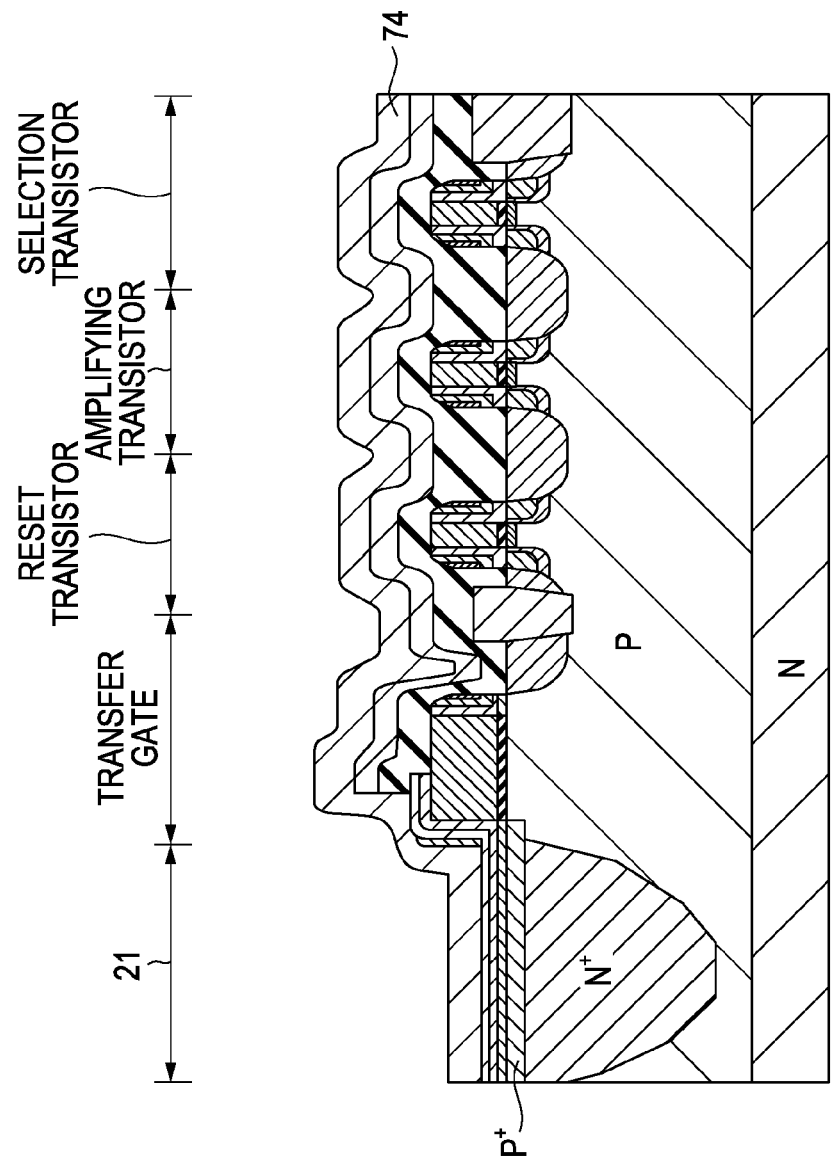
FIG. 40 is a sectional view showing a production step of a method for manufacturing a solid-state imaging device according to an embodiment of the present invention.
Figure 41:
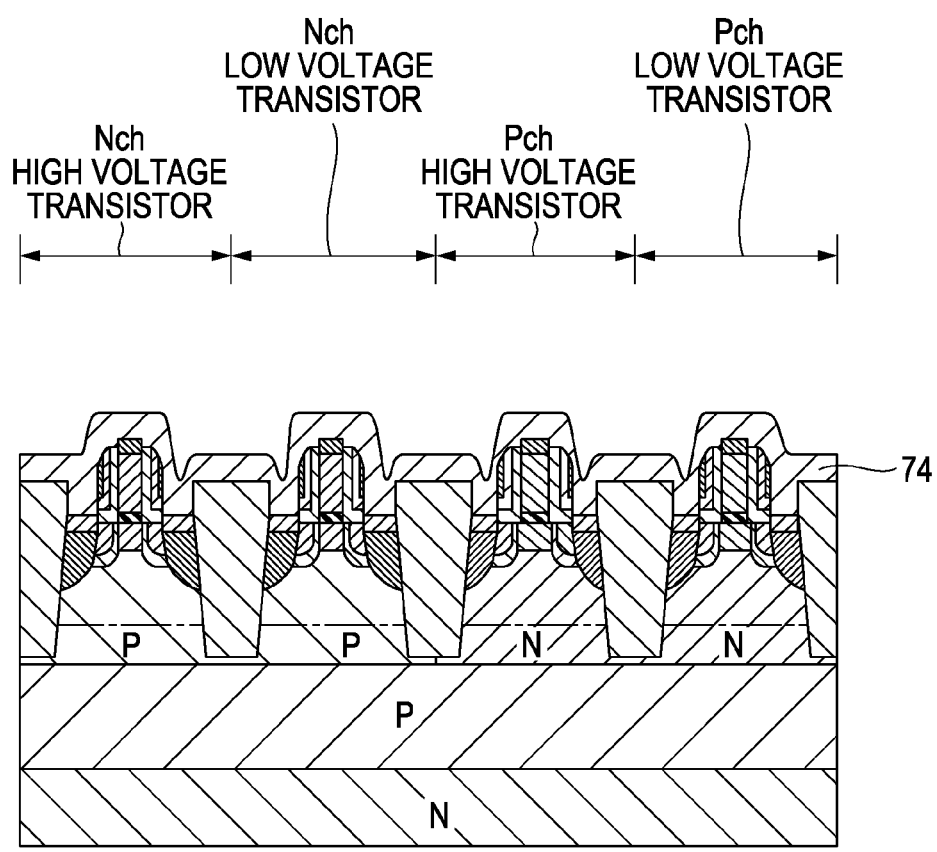
FIG. 41 is a sectional view showing a production step of a method for manufacturing a solid-state imaging device according to an embodiment of the present invention.

Next, as is indicated by a sectional view of a pixel portion shown in FIG. 40 and a sectional view of a peripheral circuit portion shown in FIG. 41, an etching stopper film 74 is formed all over the pixel portion 12 and the peripheral circuit portion 13. The above-described etching stopper film 74 is formed from, for example, a silicon nitride film. As for this silicon nitride film, for example, a silicon nitride film formed by a low pressure CVD method or a silicon nitride film formed by a plasma CVD method is used. The film thickness of the silicon nitride film is specified to be, for example, 10 nm to 100 nm.

The above-described silicon nitride film exerts an effect of minimizing over etching in the etching for forming a contact hole. Furthermore, an effect of suppressing an increase in junction leakage due to an etching damage.

Figure 42:
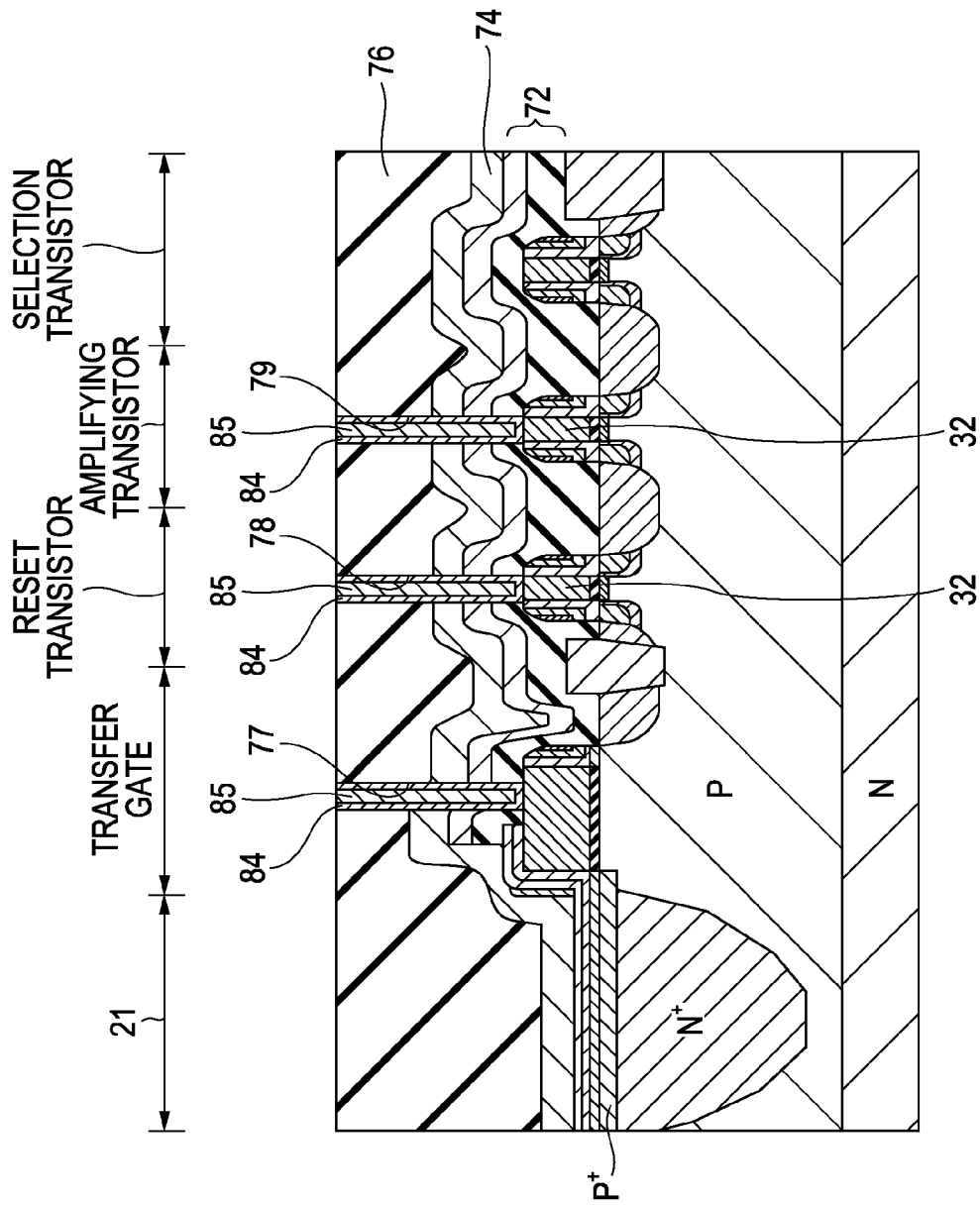
FIG. 42 is a sectional view showing a production step of a method for manufacturing a solid-state imaging device according to an embodiment of the present invention.
Figure 43:
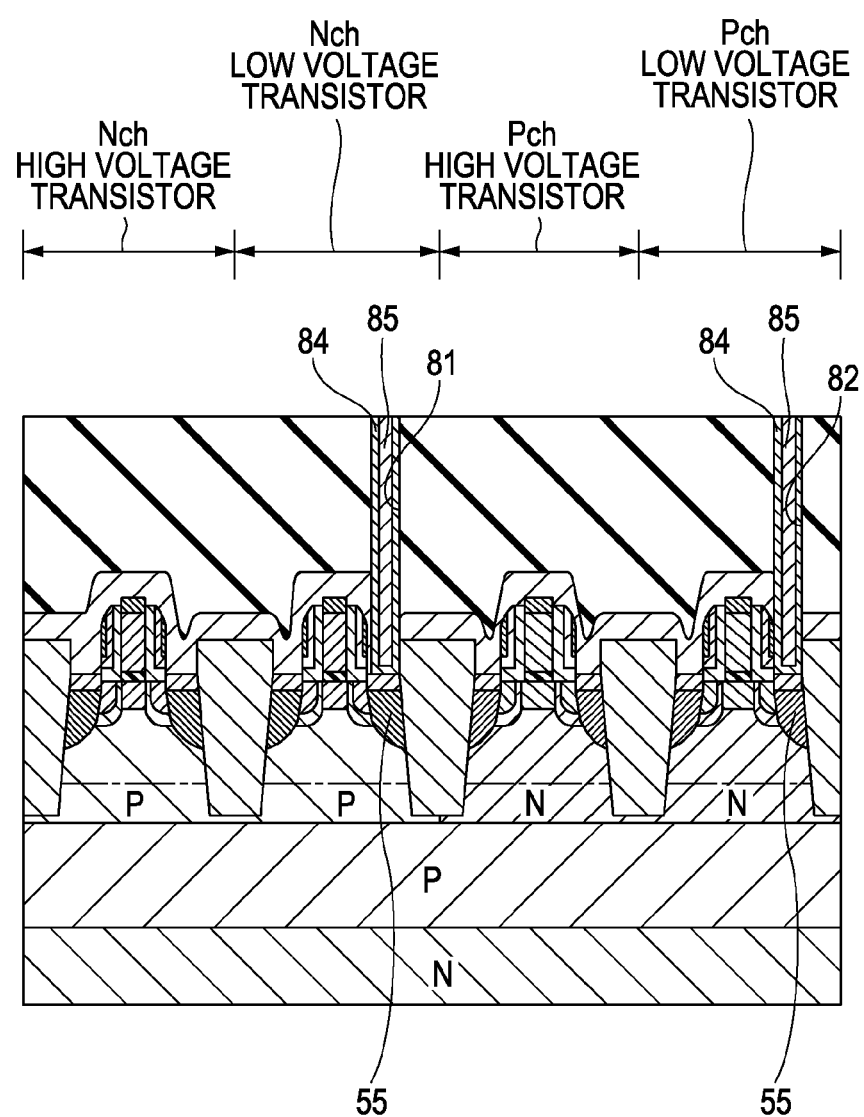
FIG. 43 is a sectional view showing a production step of a method for manufacturing a solid-state imaging device according to an embodiment of the present invention.

Subsequently, as is indicated by a sectional view of a pixel portion shown in FIG. 42 and a sectional view of a peripheral circuit portion shown in FIG. 43, an interlayer insulating film 76 is formed on the above-described etching stopper film 74. The above-described interlayer insulating film 76 is formed from, for example, a silicon oxide film and is formed having a thickness of, for example, 100 nm to 1,000 nm. The above-described silicon oxide film is formed by, for example, a CVD method. As for this silicon oxide film, TEOS, PSG, BPSG, and the like are used. Furthermore, a silicon nitride film and the like can also be used.

Then, the surface of the above-described interlayer insulating film 76 is flattened. This flattening is conducted through, for example, chemical mechanical polishing (CMP).

After a resist mask (not shown in the drawing) for forming contact holes is formed, for example, the interlayer insulating film 76, the etching stopper film 74, the second silicide block film 72, and the like in the pixel portion 12 are etched, so that contact holes 77, 78, and 79 are formed. Likewise, contact holes 81 and 82 are formed in the peripheral circuit portion 13.

In the drawings, as an example, the contact holes 77, 78, and 79 reaching the transfer gate TRG, the gate electrode 32 of the reset transistor RST, and the gate electrode 32 of the amplifying transistor Amp are shown in the pixel portion 12. Furthermore, the contact holes 81 and 82 reaching the source-drain region 55 of the N channel (Nch) low voltage transistor and the source-drain region 55 of the P channel (Pch) low voltage transistor are shown in the peripheral circuit portion 13. However, contact holes reaching the gate electrodes and source-drain regions of other transistors are also formed at the same time, although not shown in the drawing.

In the case where the above-described contact holes 77 to 79, 81, and 82 are formed, in the first step, the interlayer insulating film 76 is etched. Then, etching is temporarily stopped on the etching stopper film 74. Consequently, variations in film thickness of the interlayer insulating film 76, variations in etching, and the like are absorbed. In the second step, the etching stopper film 74 composed of silicon nitride is etched. Etching is further conducted so as to complete the contact holes 77 to 79, 81, and 82.

As for the above-described etching of the contact holes, for example, reactive ion etching apparatus is used.

Next, a plug 85 is formed in the inside of each of contact holes 77 to 79, 81, and 82 with an adhesion layer (not shown in the drawing) and a barrier metal layer 84 therebetween.

As for the above-described adhesion layer, for example, a titanium (Ti) film, a tantalum (Ta) film, and the like are used. As for the above-described barrier metal layer 84, for example, a titanium nitride film, a tantalum nitride film, and the like are used. These films are formed by, for example, a sputtering method or a CVD method.

Furthermore, as for the above-described plug 85, tungsten (W) is used. For example, the tungsten film is formed on the above-described interlayer insulating film 76 in such a way as to fill the above-described contact holes 77 to 79, 81, and 82. Thereafter, the tungsten film on the interlayer insulating film 76 is removed, so that the plugs 85 composed of tungsten are formed in the individual contact holes 77 to 79, 81, and 82. This plug 85 may be formed from aluminum (Al), copper (Cu), and the like exhibiting still lower resistance, besides tungsten. For example, in the case where copper (Cu) is used, for example, a tantalum film is used as the adhesion layer and a tantalum nitride film is used as the barrier metal layer 84.

Thereafter, a multilayer wiring is formed, although not shown in the drawing. The multilayer wiring may be multi-layered to include two layers, three layers, four layers, or more layers, as necessary.

Figure 44:
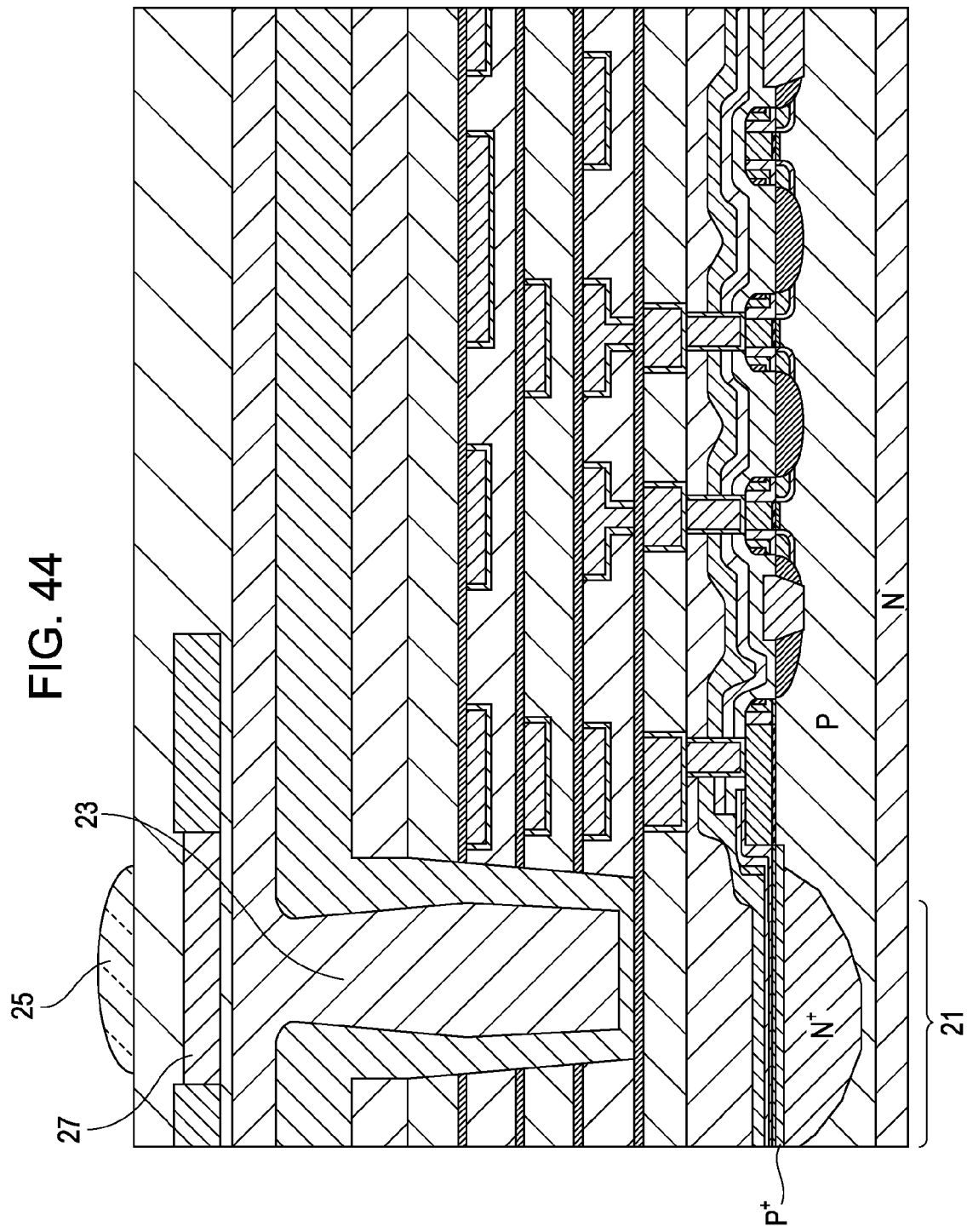
FIG. 44 is a sectional view showing a production step of a method for manufacturing a solid-state imaging device according to an embodiment of the present invention.

Next, as is indicated by a sectional view of a pixel portion shown in FIG. 44, a waveguide 23 may be formed on the photoelectric conversion portion 21. Furthermore, a condenser lens 25 may be formed in order to condense incident light on the photoelectric conversion portion 21.

Moreover, a color filter 27 to disperse light may be formed between the above-described waveguide 23 and the condenser lens 25.

Regarding the above-described method for manufacturing a solid-state imaging device, the gate insulating films 51 and 31 of the MOS transistors 50 and 30 in the peripheral circuit portion 13 and the pixel portion 12 are formed from silicon oxynitride films and, thereby, generation of a tunnel current can be prevented. Consequently, the transistor characteristics of the peripheral circuit portion and the pixel portion are improved. Furthermore, since the silicon oxynitride film just above the photoelectric conversion portion 21 is removed, deterioration in white defect and dark current due to a fixed charge in the silicon oxynitride film can be prevented. Consequently, there is an advantage that the image quality is improved.

In the above-described method for manufacturing a solid-state imaging device, the step, in which the gate insulating films 31 and 51 are removed from regions other than the regions just below the gate electrodes 32 and 52 so as to leave the gate insulating films 31 and 51 therein, is not necessarily conducted just after the gate electrodes 32 and 52 are formed. Instead, a step, in which the gate insulating films 31 and 51 are removed from regions other than the regions just below the gate electrodes 32 and 52 and the first and the second sidewalls 33 and 53 so as to leave the gate insulating films 31 and 51 therein, may be conducted just after the first and the second sidewalls 33 and 53 are formed. It is desirable that removal of the gate insulating films 31 and 51 is conducted through wet etching in order to prevent an etching damage.

In this case as well, the gate insulating films 51 and 31 of the MOS transistors 50 and 30 in the peripheral circuit portion 13 and the pixel portion 12 are formed from silicon oxynitride films and, thereby, generation of a tunnel current can be prevented. Furthermore, since the oxide film 134 instead of a silicon oxynitride film is disposed just above the photoelectric conversion portion 21, deterioration in white defect and dark current due to a fixed charge in the film just above the photoelectric conversion portion 21 can be prevented, whereas this is a problem with respect to the silicon oxynitride film.

In this regard, the gate insulating films 31 and 51 composed of silicon oxynitride films remain just below the individual first and the second sidewalls 33 and 53. Consequently, it is feared that deterioration in white defect due to a positive fixed charge at an edge of the transfer gate TRG occurs to some extent as compared with that of the solid-state imaging device 1 of the above-described first example. However, deterioration in white defect due to a fixed charge can be suppressed as compared with a solid-state imaging device in the related art.

Furthermore, it is preferable that removal of the silicon oxynitride film used for the gate insulating film on the photoelectric conversion portion 21 is conducted in as late a step as possible from the viewpoint of prevention of contamination of the photoelectric conversion portion 21.

In the above-described first example, after the gate electrode is worked, an oxide film 133 is formed also on the photoelectric conversion portion 21 through oxidation of the sidewall of the gate electrode in such a way that a resist mask is not formed directly on the photoelectric conversion portion 21 in the downstream, so as to suppress contamination.

However, the film thickness of the oxide film 133 exerts an influence on the logic characteristics of the peripheral circuit, and if the film thickness is too large, the current drivability of the transistor deteriorates so as to invite a reduction in an operation speed. It is difficult to increase the film thickness of the oxide film 133 to a large extent. For example, 10 nm or less is preferable.

In this regard, even if the film thickness of the oxide film 133 just above the photoelectric conversion portion 21 is small, an influence of contamination exerted on deterioration in white defect is reduced by using a resist which causes less contamination or conducting cleaning sufficiently, although the throughput is reduced. There is no problem in the above-described cases. However, in the case where contamination due to the resist is predominant, it is desirable that removal of the silicon oxynitride film is conducted in as late a step as possible from the viewpoint of prevention of contamination of the photoelectric conversion portion 21.

Furthermore, regarding the working of the silicon nitride film to form the sidewall, etching may be stopped by the silicon oxide film on the photoelectric conversion portion 21 and, thereafter, wet peeling may be conducted so as to remove the silicon oxynitride film just above the photodiode.

In that case, as described above, the silicon oxynitride films remain just below the sidewalls 33 and 53, and deterioration in white defect and dark current resulting from that portion may occur. However, if the degree of influence is larger than the influence of the above-described resist contamination, the white defect and the dark current are improved by peeling off the silicon oxynitride film on the photoelectric conversion portion 21.

As described above, in the present invention, the silicon oxynitride film is applied to the gate insulating film and, thereby, effects are exerted on an improvement of the operation speed of the MOS transistors 50 in the peripheral circuit portion 13, suppression of a tunnel current, suppression of an increase in power consumption and, in addition, avoidance of deterioration in the imaging characteristics of the CMOS sensor.

Regarding the antireflection portion just above the photoelectric conversion portion 21, the silicon oxynitride film used for the gate insulating film just above the photoelectric conversion portion 21 is removed. Consequently, the structure just above the photoelectric conversion portion 21 is composed of silicon oxide ($SiO_2$)/silicon nitride (SiN)/silicon oxide ($SiO_2$). Since a multiple structure is avoided, deterioration of ripple does not occur, the characteristics of dispersion of light are improved, and optimization is facilitated.

Furthermore, since deterioration in white defect can be prevented, it is not necessary to set the $P^+$ concentration of a buried photodiode at a high level in the photoelectric conversion portion 21. If the $P^+$ concentration is set at a high level, the area of the photodiode becomes relatively small, so that a reduction in the amount of saturation charge (Qs) is invited. Moreover, the concentration at the end of the transfer gate TRG increases and deterioration of an after image is invited. On the other hand, regarding the solid-state imaging devices 1 and 2 according to an embodiment of the present invention, the $P^+$ concentration of the surface of the buried photodiode can be made relatively low and, therefore, deterioration of the amount of saturation charge (Qs), an after image, and the like can be prevented.

Moreover, the silicon oxynitride films serving as the gate insulating films 31 and 51 in regions other than the regions just below the gate electrodes 32 and 52 are removed, and a fresh oxide film 133 is formed on the photoelectric conversion portion 21. Consequently, the controllability of an implantation profile in each ion implantation is improved.

In the explanation of each of the above-described examples, the P-well is formed in the N-type substrate and photodiode of the photoelectric conversion portion 21 is formed from the $P^+$ layer and the $N^+$ layer in that order from the upper layer. However, it is also possible to form an N-well in a P-type substrate and form the photodiode of the photoelectric conversion portion 21 from the $N^+$ layer and the $P^+$ layer in that order from the upper layer.

Furthermore, in the explanation of the configuration of the above-described manufacturing method, the above-described transfer gate and the pixel transistors, i.e. the reset transistor, the amplifying transistor, and the selection transistor, are isolated by the element isolation region 14. Therefore, the source-drain region 34 of the above-described amplifying transistor is formed as the diffusion layer common to the source-drain region 35 of the reset transistor, and the source-drain region 35 of the above-described amplifying transistor is formed as the diffusion layer common to the source-drain region 34 of the selection transistor SEL.

In this regard, even in the case where no element isolation region 14 is disposed between the above-described transfer gate and the above-described reset transistor and a diffusion layer common to the above-described transfer gate TRG and the above-described reset transistor RST is disposed, a manufacturing method similar to that described above can be applied. In this case, the diffusion layer of the transfer gate and the diffusion layer (source-drain region 34) of the reset transistor may be formed as a common diffusion layer.

Moreover, a manufacturing method similar to that described above can be applied to the configuration in which the above-described reset transistor, the amplifying transistor, and the selection transistor are isolated individually by the element isolation regions 14.

In addition, regarding the group of transistors in the above-described pixel portion 12, although not shown in the drawing, a transfer gate TRG, a selection transistor SEL, an amplifying transistor Amp, and a reset transistor RST may be sequentially disposed in series while being connected to the above-described photoelectric conversion portion 21.

Next, an imaging apparatus according to an embodiment of the present invention will be described with reference to a block diagram shown in FIG. 45. This imaging apparatus includes the solid-state imaging device according to an embodiment of the present invention.

Figure 45:
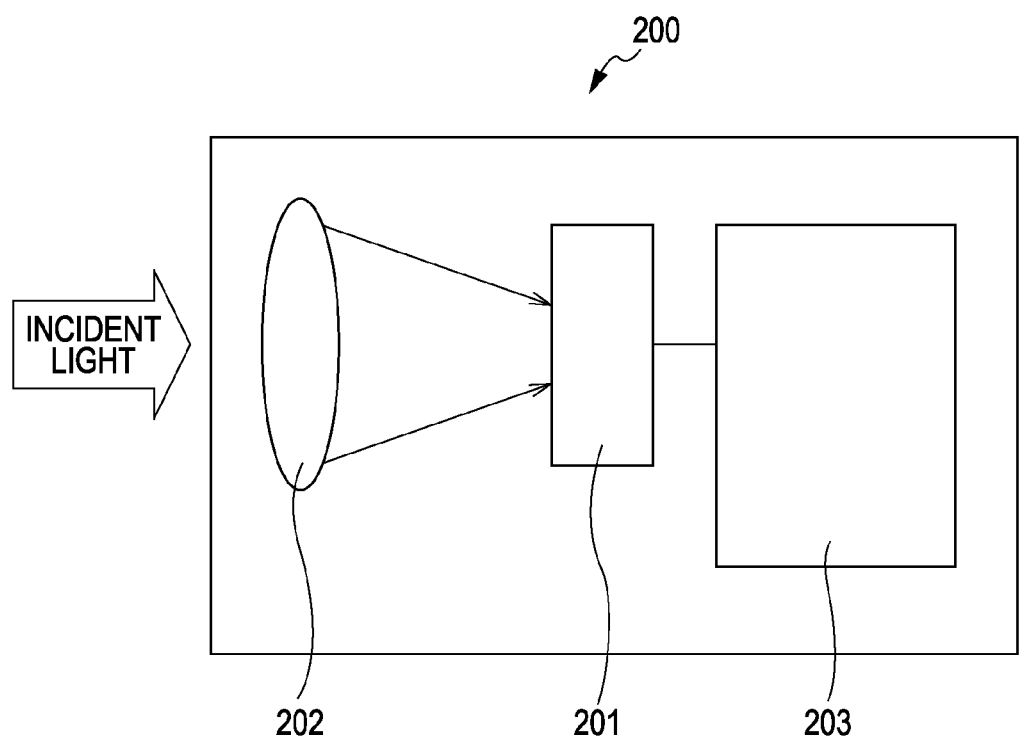
FIG. 45 is a block diagram showing an imaging apparatus according to an embodiment of the present invention.
Figure 46:
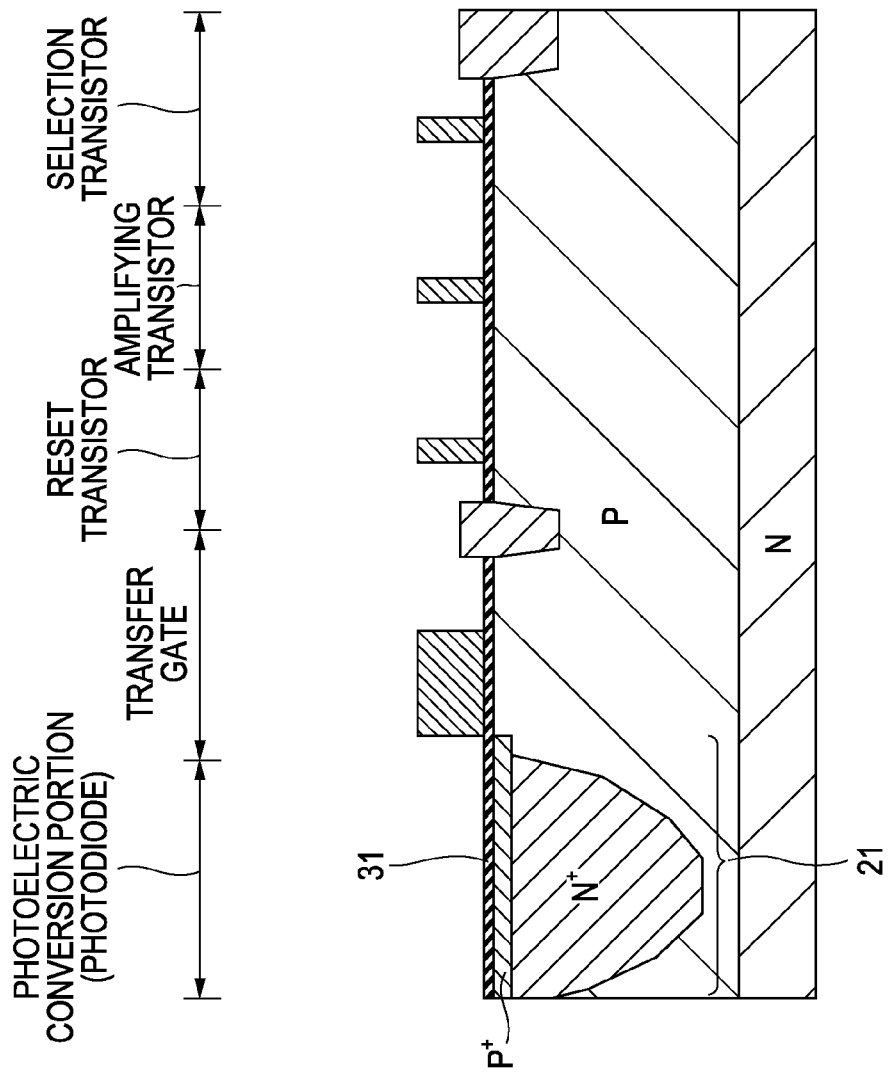
FIG. 46 is a schematic configuration sectional view of a CMOS sensor in the related art.
Figure 47:
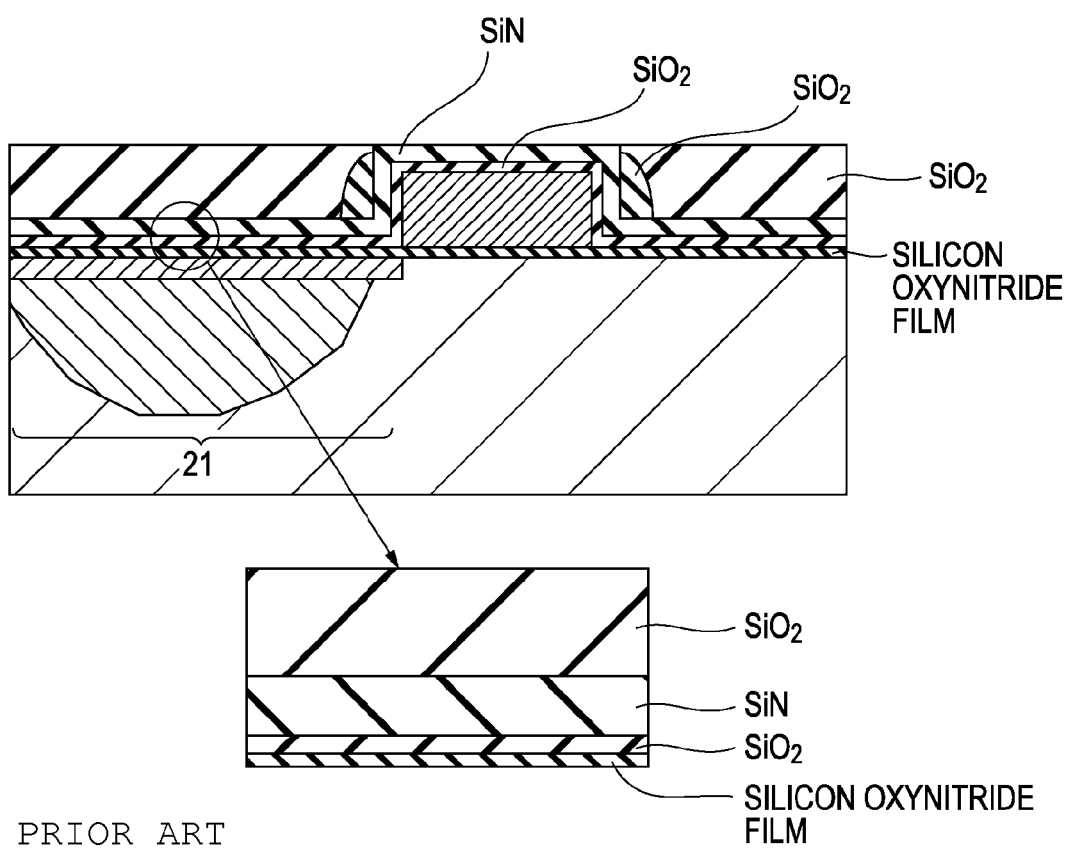
FIG. 47 is a schematic configuration sectional view of a CMOS sensor in the related art.

As shown in FIG. 45, an imaging apparatus 200 includes a solid-state imaging device (not shown in the drawing) in an imaging portion 201. A light-condensing optical portion 202 to form an image is provided on the light-condensing side of this imaging portion 201. Furthermore, the imaging portion 201 is connected to a signal processing portion 203 including a drive circuit to drive the imaging portion 201, a signal processing circuit to process the signal, which is photoelectrically converted with the solid-state imaging device, into an image, and the like. Moreover, the image signal processed with the above-described signal processing portion 203 can be stored in an image storage portion (not shown in the drawing). In such an imaging apparatus 200, as for the above-described solid-state imaging device, the solid-state imaging device 1 described in the above-described embodiment can be used.

Regarding the imaging apparatus 200 according to an embodiment of the present invention, since the solid-state imaging device 1 according to an embodiment of the present invention is included, the sensitivity of the photoelectric conversion portion of each pixel is ensured sufficiently in a manner similar to that described above. Consequently, there is an advantage that the pixel characteristics are improved, for example, white defects can be reduced.

Incidentally, the imaging apparatus 200 according to the present invention is not limited to the above-described configuration and can be applied to any imaging apparatus having a configuration including the solid-state imaging device.

The above-described solid-state imaging device 1 may be in the form of one chip or in the form of a module in which an imaging portion and a signal processing portion or an optical system are packaged collectively and which has an imaging function. Furthermore, the present invention can be applied to the above-described imaging apparatus. In this case, the imaging apparatus exerts an effect of improving an image quality. Here, the imaging apparatus refers to, for example, cameras and portable apparatuses having an imaging function. Furthermore, a term "imaging" is interpreted in a broad sense and includes not only capture of an image in usual picture taking with a camera, but also detection of fingerprints and the like.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a pixel portion configured to have a plurality of photoelectric conversion elements;
a peripheral circuit portion configured to be located outside of a periphery of the pixel portion; and
wherein the peripheral circuit portion includes one or more first transistors and a first gate insulating film, the pixel portion includes a transfer transistor and one or more second transistors and a second gate insulating film, and a film disposed over the photoelectric conversion elements, the film including at least two layers abutting each other, and composed of a same material;
wherein at least one of the at least two layers is disposed directly above the pixel portion and abuts the second gate insulating film.

2. The solid-state imaging device according to claim 1, wherein:

a sidewall is disposed on a side of the gate electrode of each of the first transistors in the peripheral circuit portion;

a sidewall is disposed on the side of a gate electrode of each of the second transistors in the pixel portion; and for each of the first and second transistors, a silicon oxynitride film serving as the gate insulating film extends just below both sidewalls.

3. The solid-state imaging device according to claim 1, wherein the material is an oxide layer.

4. The solid-state imaging device according to claim 1, further comprising:

another film formed from a laminate film in the pixel portion and extending beyond the photoelectric conversion elements.

5. The solid-state imaging device according to claim 1, wherein the first gate insulating film is the same material as the second gate insulating film.

6. The solid-state imaging device according to claim 1, wherein the material is a silicon oxynitride.

7. An imaging apparatus comprising:

an optical section;

an imaging section configured to have a pixel portion and a peripheral circuit portion;

a signal processing section configured to process a signal output from a plurality of photoelectric conversion elements in the pixel portion; and wherein the peripheral circuit portion includes one or more first transistors and a first gate insulating film, the pixel portion includes a transfer transistor and one or more second transistors and a second gate insulating film, and a film disposed over the photoelectric conversion elements, the film including at least two layers abutting each other, and composed of a same material;

wherein at least one of the at least two layers is disposed directly above the pixel portion and abuts the second gate insulating film.

8. The imaging apparatus according to claim 7, wherein a sidewall is disposed on a side of the gate electrode of each of the first transistors in the peripheral circuit portion;

a sidewall is disposed on the side of a gate electrode of each of the second transistors in the pixel portion; and for each of the first and second transistors, a silicon oxynitride film serving as the gate insulating film extends just below both sidewalls.

9. The imaging apparatus according to claim 7, wherein the material is an oxide layer.

10. The imaging apparatus according to claim 7, further comprising:

another film formed from a laminate film in the pixel portion and extending beyond photoelectric conversion portions of the pixel portion.

11. The imaging apparatus according to claim 7, wherein the first gate insulating film is the same material as the second gate insulating film.

12. The imaging apparatus according to claim 7, wherein the material is a silicon oxynitride.

* * * * *